(12) United States Patent
Park et al.

(10) Patent No.: US 11,943,862 B2
(45) Date of Patent: Mar. 26, 2024

(54) BOARD HAVING CONDUCTIVE LAYER FOR SHIELDING ELECTRONIC COMPONENT AND ELECTRONIC DEVICE INCLUDING THE SAME

(71) Applicant: Samsung Electronics Co., Ltd., Suwon-si (KR)

(72) Inventors: Bongchoon Park, Suwon-si (KR); Taewon Sun, Suwon-si (KR); Sangyong Kim, Suwon-si (KR); Bosung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 182 days.

(21) Appl. No.: 17/825,508

(22) Filed: May 26, 2022

(65) Prior Publication Data

US 2023/0035240 A1 Feb. 2, 2023

Related U.S. Application Data

(63) Continuation of application No. PCT/KR2022/006965, filed on May 16, 2022.

(30) Foreign Application Priority Data

Jul. 23, 2021 (KR) .................. 10-2021-0097341

(51) Int. Cl.
*H05K 1/18* (2006.01)
*H05K 1/02* (2006.01)
*H05K 1/11* (2006.01)

(52) U.S. Cl.
CPC ......... *H05K 1/0216* (2013.01); *H05K 1/0242* (2013.01); *H05K 1/111* (2013.01);
(Continued)

(58) Field of Classification Search
CPC ...... H05K 1/0242; H05K 1/111; H05K 1/115; H05K 1/181; H05K 2201/0715; H05K 2201/10037
See application file for complete search history.

(56) References Cited

U.S. PATENT DOCUMENTS 7,186,928 B2 3/2007 Kikuchi et al.
7,465,884 B2 12/2008 Ooyabu et al.
(Continued)

FOREIGN PATENT DOCUMENTS

JP H09-307273 A 11/1997
JP 2001-217588 A 8/2001
(Continued)

OTHER PUBLICATIONS

International Search Report dated Aug. 31, 2022, issued in International Application No. PCT/KR2022/006965.

*Primary Examiner* — Muhammad S Islam
(74) *Attorney, Agent, or Firm* — Jefferson IP Law, LLP

(57) ABSTRACT

An electronic device is provided. The electronic device includes a board including a first conductive line, a second conductive line, a ground plane, and a conductive via hole connecting the first conductive line and the ground plane, at least one electronic component disposed in the board, an insulation member covering the at least one electronic component, and a conductive layer, the conductive layer includes a first part formed on a surface of the insulation member, a second part extending from an edge of the first part and electrically connected to the first conductive line, and a third part spaced apart from the second part and electrically connected to the second conductive line, and the electronic device includes at least one transmission line constituted by the second conductive line and the third part of the conductive layer.

20 Claims, 21 Drawing Sheets

(52) U.S. Cl.
CPC ............. *H05K 1/115* (2013.01); *H05K 1/181* (2013.01); *H05K 2201/0715* (2013.01); *H05K 2201/10037* (2013.01)

(56) References Cited

U.S. PATENT DOCUMENTS

| | | |
|---|---|---|
| 9,282,630 B2 | 3/2016 | Merz |
| 10,756,024 B2 | 8/2020 | Kitazaki et al. |
| 2005/0248909 A1 | 11/2005 | Kikuchi et al. |
| 2013/0286609 A1 | 10/2013 | Merz |
| 2015/0016066 A1 | 1/2015 | Shimamura et al. |
| 2018/0286796 A1 | 10/2018 | Kitazaki et al. |
| 2021/0099560 A1* | 4/2021 | Kim .................. H04M 1/0277 |

FOREIGN PATENT DOCUMENTS

| | | |
|---|---|---|
| JP | 2002-334954 A | 11/2002 |
| JP | 2004-071658 A | 3/2004 |
| JP | 2007-096064 A | 4/2007 |
| JP | 2007-294483 A | 11/2007 |
| JP | 2015-035572 A | 2/2015 |
| KR | 10-2006-0131201 A | 12/2006 |

\* cited by examiner

BOARD HAVING CONDUCTIVE LAYER FOR SHIELDING ELECTRONIC COMPONENT AND ELECTRONIC DEVICE INCLUDING THE SAME

CROSS-REFERENCE TO RELATED APPLICATION(S)

This application is a continuation application, claiming priority under § 365(c), of an International application No. PCT/KR2022/006965, filed on May 16, 2022, which is based on and claims the benefit of a Korean patent application number 10-2021-0097341, filed on Jul. 23, 2021, in the Korean Intellectual Property Office, the disclosure of each of which is incorporated by reference herein in its entirety.

TECHNICAL FIELD

The disclosure relates to a board having a conductive layer for shielding an electronic component, and an electronic device including the same.

BACKGROUND ART

As demands on portable electronic devices increase, the electronic devices need to have small sizes and light weights. As a measure for downsizing the electronic devices includes, for example, a system-in-package technology. The system-in-package technology is a technology of mounting a plurality of electronic components (e.g., semiconductor chips, semiconductor elements, or integrated circuits including the same) in one package to implement one system, and may remarkably reduce a space for mounting components that are necessary to implement one system.

The above information is presented as background information only to assist with an understanding of the disclosure. No determination has been made, and no assertion is made, as to whether any of the above might be applicable as prior art with regard to the disclosure.

DISCLOSURE

Technical Problem

FIG. 12 is a cross-sectional view of a board according to the related art.

Referring to FIG. 12, an electronic device 1202 according to the conventional technology may include a board 1280, at least one electronic component 1203 disposed on the board 1280, an insulation member 1205 that protects the at least one electronic component 1203, and a conductive layer 1210 that surrounds the insulation member 1205.

The board 1208 of the electronic device 1202 of the conventional technology may include a conductive line 1281 electrically connected to a ground plane (not illustrated) provided in the board 1208. A conductive layer 1210 may be electrically connected to the conductive line 1281 to provide electromagnetic shielding to at least one electronic component 1203 together with the ground plane of the board 1280.

As described above, for the conductive layer 1210 to provide shielding of the at least one electronic component 1203, the conductive layer 1210 may require a portion 1212 that extends toward an outside of the insulation member 1205 to be connected to the conductive line 1281 of the board 1280. The portion 1212 of the conductive layer 1210 is a portion that is essentially formed in consideration of a tolerance for a manufacturing process, and the portion 1212 of the conductive layer 1210 is used only for the purpose for grounding to the board 480. Accordingly, a mounting space of the board 1280 may be wasted.

Aspects of the disclosure are to address at least the above-mentioned problems and/or disadvantages and to provide at least the advantages described below. Accordingly, an aspect of the disclosure is to provide a board, in which a portion of a conductive layer may be utilized as a transmission line for transmitting and receiving an electrical signal, and an electronic device including the same.

Additional aspects of the disclosure will be set forth in part in the description which follows and, in part, will be apparent from the description, or may be learned by practice of the presented embodiments.

Technical Solution

In accordance with an aspect of the disclosure, an electronic device is provided. The electronic device includes a board including a first conductive line, a second conductive line spaced apart from the first conductive line, a ground plane, and a conductive via hole electrically connecting the first conductive line and the ground plane, at least one electronic component disposed on a first surface of the board to at least partially overlap the ground plane, an insulation member covering the at least one electronic component, and a conductive layer, the conductive layer includes a first part formed on a surface of the insulation member, a second part formed on the first surface of the board to extend from at least a portion of an edge of the first part in a direction that becomes farther away from the insulation member, and electrically connected to the first conductive line, and a third part spaced apart from the second part, extending from the first surface of the board in a direction that becomes farther away from the insulation member, and electrically connected to the second conductive line, the first conductive line and the second part of the conductive layer are spaced apart from the second conductive line and the third part of the conductive layer while an opening formed in the board being interposed therebetween, and the electronic device includes at least one transmission line including the second conductive line and the third part of the conductive layer and that transmits an electrical signal.

In accordance with another aspect of the disclosure, a board of an electronic device is provided. The board includes a first conductive line, a second conductive line spaced apart from the first conductive line, a ground plane, a conductive via hole electrically connecting the first conductive line and the ground plane, at least one electronic component disposed on a first surface of the board to at least partially overlap the ground plane, an insulation member covering the at least one electronic component, and a conductive layer, the conductive layer includes a first part formed on a surface of the insulation member, a second part formed on the first surface of the board to extend from at least a portion of an edge of the first part in a direction that becomes farther away from the insulation member, and electrically connected to the first conductive line, and a third part spaced apart from the second part, extending from the first surface of the board in a direction that becomes farther away from the insulation member, and electrically connected to the second conductive line, the first conductive line and the second part of the conductive layer are spaced apart from the second conductive line and the third part of the conductive layer while an opening formed in the board being interposed therebetween, and the board includes at least one transmission line including the second conductive line and the third part of the conductive layer and that transmits an electrical signal.

Advantageous Effects

According to the embodiments of the disclosure, a portion of the conductive layer for providing shielding may be utilized as a transmission line for transmitting and receiving an electrical signal.

According to the embodiments of the disclosure, because a portion of the conductive layer for providing shielding may be utilized as a transmission line for transmitting and receiving an electrical signal, a mounting space of the board may be saved.

According to the embodiments of the disclosure, while a portion of the conductive layer for providing shielding may be utilized as a transmission line for transmitting and receiving an electrical signal, a required shielding performance may be satisfied.

According to the embodiments of the disclosure, because a portion of the conductive layer for providing shielding may be utilized as a transmission line for transmitting and receiving an electrical signal, it is possible to downsizing the electronic device.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
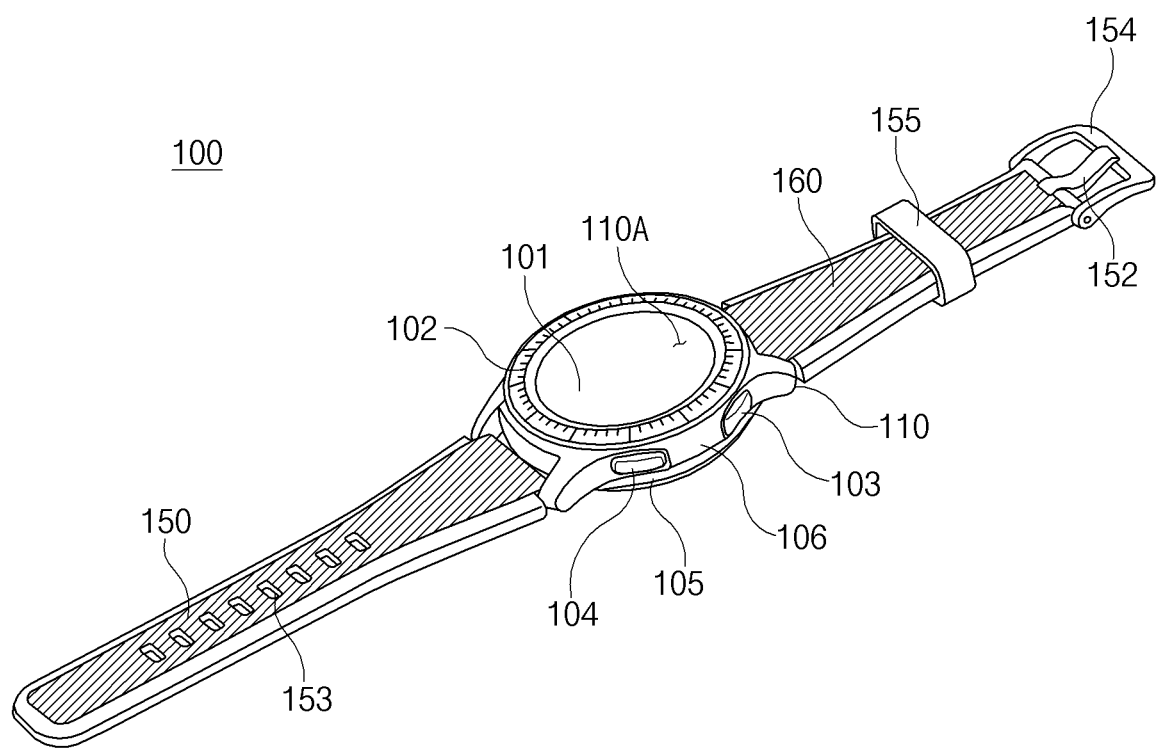
FIG. 1 is a perspective view of a front surface of an electronic device according to an embodiment of the disclosure.

FIG. 1 is a perspective view of a front surface of an electronic device according to an embodiment of the disclosure.

Figure 2:
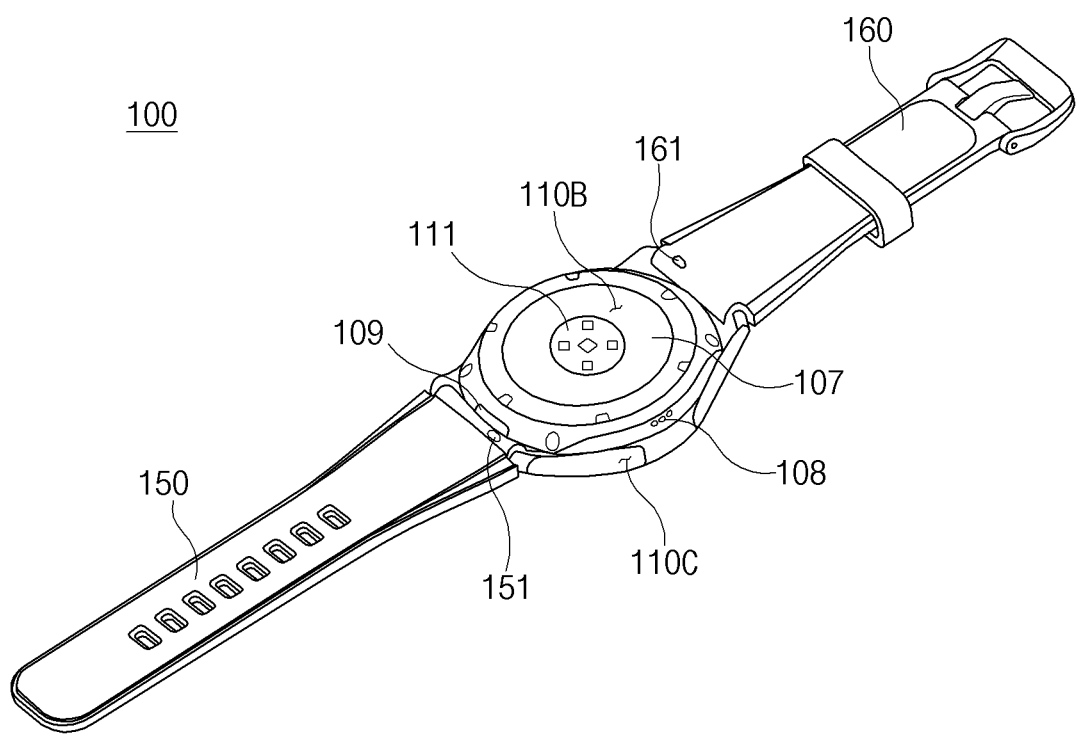
FIG. 2 is a perspective view of a rear surface of an electronic device according to an embodiment of the disclosure.

FIG. 2 is a perspective view of a rear surface of an electronic device according to an embodiment of the disclosure.

Referring to FIGS. 1 and 2, an electronic device 100 according to an embodiment may include a housing 110 including a first surface (or a front surface) 110A, a second surface (or a rear surface) 110B, and a side surface 110C surrounding a space between the first surface 110A and the second surface 110B, and fastening members 150 and 160 connected to at least portions of the housing 110 and that detachably fastens the wearable electronic device 100 to a portion (e.g., a wrist or a wrinkle) of the body of a user. In another embodiment (not illustrated), the housing may refer to a structure that defines some of the first surface 110A, the second surface 110B, and the side surface 110C of FIG. 1. According to an embodiment, the first surface 110A may be defined by a front plate 101 (e.g., a glass plate or a polymer plate including various coating layers), at least a portion of which is substantially transparent. The second surface 110B may be defined by a substantially opaque rear plate 107. The rear plate 107, for example, may be formed of coated or colored glass, ceramics, a polymer, a metal (e.g., aluminum (Al), stainless steel (STS), or magnesium (Mg)), or a combination of at least two thereof. The side surface 110C may be coupled to the front plate 101 and the rear plate 107, and may be defined by a side bezel structure (or 'a side member') 106 including a metal and/or a polymer. In some embodiments, the rear plate 107 and the side bezel structure 106 may be integrally formed and may include the same material (e.g., a metallic material such as aluminum). The fastening members 150 and 160 may be formed of various material and have various shapes. A single body or a plurality of unit links that may move with respect to each other may be formed of woven fabric, leather, rubber, urethane, a metal, ceramics, or a combination of at least two thereof.

According to an embodiment, the electronic device 100 may include at least one of a display 120 (see FIG. 3), audio modules 105 and 108, a sensor module 111, key input devices (or buttons) 102, 103, and 104, and a connector hole 109. In some embodiments, at least one (e.g., the key input devices 102, 103, and 104, the connector hole 109, or the sensor module 111) may be omitted from the electronic device 100 or another component may be additionally included in the electronic device 100.

The display 120, for example, may be exposed through a corresponding portion of the front plate 101. The shape of the display 120 may correspond to the shape of the front plate 101, and may include various shapes, such as a circular shape, an elliptical shape, or a polygonal shape. The display 120 may be coupled to or be disposed to be adjacent to a touch detection circuit, a pressure sensor that may measure an intensity (a pressure) of a touch, and/or a fingerprint sensor.

The audio modules 105 and 108 may include a microphone hole 105 and a speaker hole 108. A microphone for acquiring external sounds may be disposed in the microphone hole 105, and in some embodiments, a plurality of microphones may be disposed to detect the direction of a sound. The speaker hole 108 may be used for an external speaker and a communication receiver. In some embodiments, the speaker hole 108 and the microphone hole 105 may be realized by one hole or a speaker may be included while the speaker hole 108 is not employed (e.g., a piezoelectric speaker).

The sensor module 111 may generate an electrical signal or a data value corresponding to an operation state of the interior of the electronic device 100 or an environmental state of the outside. The sensor module 111, for example, may include a biometric sensor module 111 (e.g., a heart rate monitor (HRM) sensor) disposed on the second surface 110B of the housing 110. The electronic device 100 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor.

The key input devices 102, 103, and 104 may include a wheel key 102 disposed on the first surface 110A of the housing 110 and being rotatable in at least one direction, and/or side key buttons 103 and 104 disposed on the side surface 110C of the housing 110. The wheel key 102 may have a shape corresponding to the shape of the front plate 101. In another embodiment, the electronic device 100 may not include some or all of the above-mentioned key input devices 102, 103, and 104, and the key input devices 102, 103, and 104 which are not included, may be realized in different forms, such as a soft key, on the display 120. The connector hole 109 may accommodate a connector (e.g., a USB connector) for transmitting and receiving power and/or data to and from an external electronic device, and may include another connector hole (not illustrated) that may accommodate a connector for transmitting and receiving an audio signal to and from an external electronic device. The electronic device 100, for example, may further include a connector cover (not illustrated) that covers at least a portion of the connector hole 109 to interrupt introduction of external foreign substances through the connector hole 109.

The fastening members 150 and 160 may be detachably fastened to at least a partial area of the housing 110 by using locking members 151 and 161. The fastening members 150 and 160 may include one or more of a fixing member 152, a fixing member coupling hole 153, a band guide member 154, and a band fixing ring 155.

The fixing member 152 may be configured to fix the housing 110 and the fastening members 150 and 160 to a portion (e.g., a wrist or a wrinkle) of the body of the user. The fixing member coupling hole 153 may fix the housing 110 and the fastening members 150 and 160 to a portion of the body of the user in correspondence to the fixing member 152. The band guide member 154 may be configured to restrict a motion range of the fixing member 152 when the fixing member 152 is coupled to the fixing member coupling hole 153 so that the fastening members 150 and 160 are fastened to be attached to a portion of the body of the user. The band fixing ring 155 may restrict motion ranges of the fastening members 150 and 160 in a state in which the fixing member 152 and the fixing member coupling hole 153 are coupled to each other.

Figure 3:
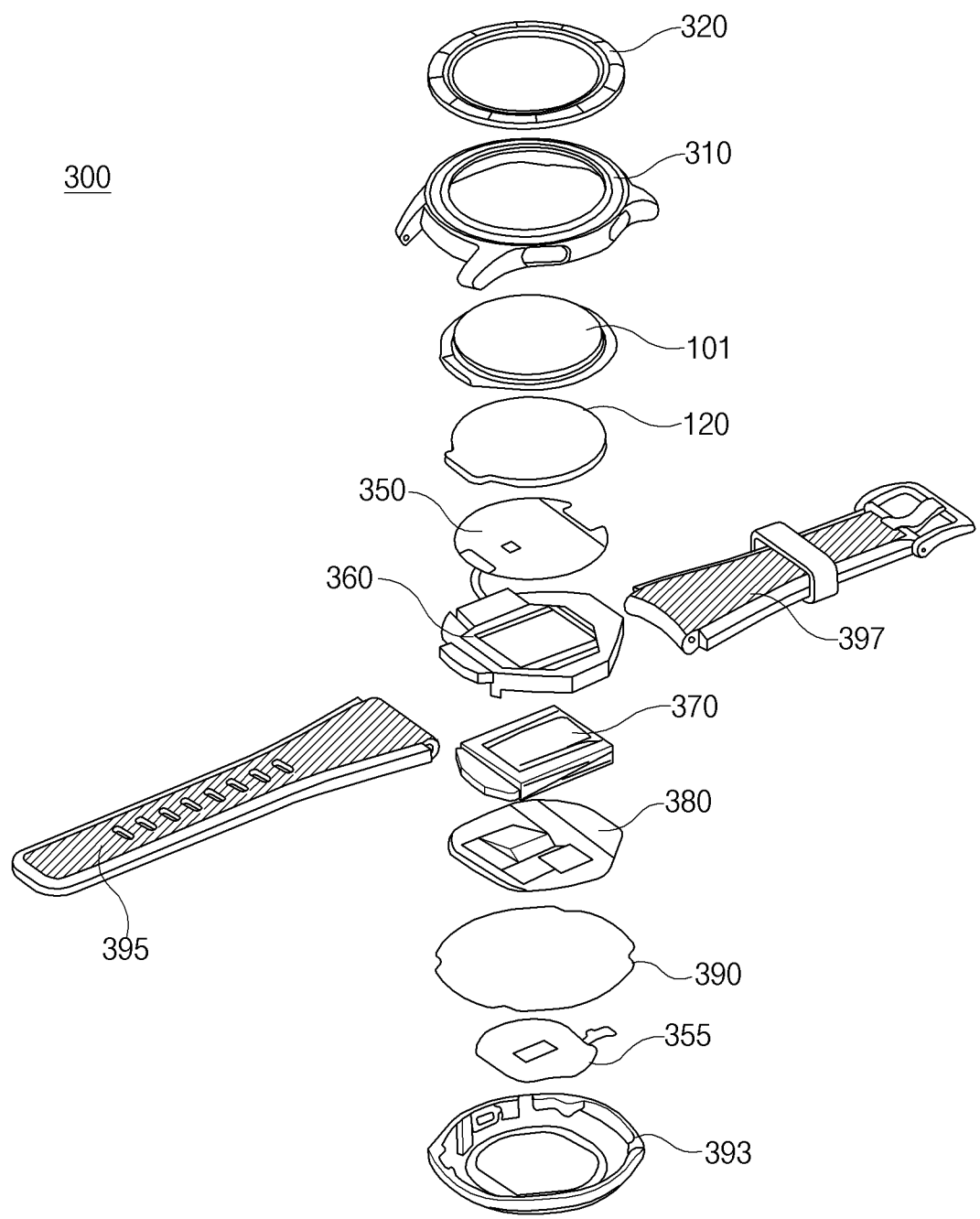
FIG. 3 is an exploded perspective view of an electronic device according to an embodiment of the disclosure.

FIG. 3 is an exploded perspective view of an electronic device according to an embodiment of the disclosure.

Referring to FIG. 3, an electronic device 300 (e.g., the electronic device 100 of FIG. 1) may include a side bezel structure 310 (e.g., the side bezel structure 106 of FIG. 1), a wheel key 320 (e.g., the wheel key 102 of FIG. 1), a front plate 101, a display 120, a first antenna 350, a second antenna 355, a support member 360 (e.g., a bracket) a battery 370 (e.g., a battery 1189 of FIG. 11), a printed circuit board 380 (e.g., a printed circuit board (PCB), a printed board assembly (PBA), a flexible PCB (FPCB) or a rigid-flexible PCB (RFPCB)), a sealing member 390, a rear plate 393 (e.g., the rear plate 107 of FIG. 2), and fastening members 395 and 397 (e.g., the fastening members 150 and 160 of FIGS. 1 and 2). At least one of the components of the electronic device 300 may be the same as or similar to at least one of the components of the electronic device 100 of FIGS. 1 and 2, and a repeated description thereof will be omitted. The support member 360 may be disposed in the interior of the electronic device 300 to be connected to the side bezel structure 310 or to be integrally formed with the side bezel structure 310. The support member 360, for example, may be formed of a metallic material and/or a nonmetallic material (e.g., a polymer). The display 120 may be coupled to one surface of the support member 360, and the printed circuit board 380 may be coupled to an opposite surface of the support member 360. A processor, a memory, and/or an interface may be mounted on the printed circuit board 380. The processor, for example, may include one or more of a central processing unit (CPU), an application processor (AP), a graphic processing unit (GPU), a sensor processor, or a communication processor.

The memory, for example, may include a volatile and/or nonvolatile memory. The interface, for example, may include a high definition multimedia interface (HDMI), a universal serial bus (USB), a secure digital (SD) card interface, and/or an audio interface. The interface, for example, may electrically or physically connect the electronic device 300 to an external electronic device, and may include a USB connector, an SD card/multimedia card (MMC) connector, and an audio connector.

The battery 370 is a device for supplying electric power to at least one component of the electronic device 300, and for example, may include a primary battery that cannot be recharged, a secondary battery that may be recharged, or a fuel cell. At least a portion of the battery 370, for example, may be disposed on substantially the same plane as the printed circuit board 380. The battery 370 may be integrally disposed in the interior of the electronic device 100, and may be disposed to be detachable from the electronic device 100.

The first antenna 350 may be disposed between the display 120 and the support member 360. The first antenna 350, for example, may include a near field communication (NFC) antenna, a wireless charging antenna, and/or a magnetic secure transmission (MST) antenna. The first antenna 350, for example, may perform short-range communication with an external device, may wirelessly transmit and receive electric power that is necessary for charging, and may transmit a short range communication signal or a magnetism-based signal including payment data. In another embodiment, an antenna structure may be formed by one or a combination of the side bezel structure 310 and/or the support member 360.

The second antenna 355 may be disposed between the circuit board 380 and the rear plate 393. The second antenna 355, for example, may include a near field communication (NFC) antenna, a wireless charging antenna, and/or a magnetic secure transmission (MST) antenna. The second antenna 355, for example, may perform short-range communication with an external device, may wirelessly transmit and receive electric power that is necessary for charging, and may transmit a short range communication signal or a magnetism-based signal including payment data. In another embodiment, an antenna structure may be formed by one or a combination of the side bezel structure 310 and/or the rear plate 393.

The sealing member 390 may be located between the side bezel structure 310 and the rear plate 393. The sealing member 390 may be configured to interrupt moisture and foreign substances that are introduced into a space surrounded by the side bezel structure 310 and the rear plate 393 from the outside.

Figure 4:
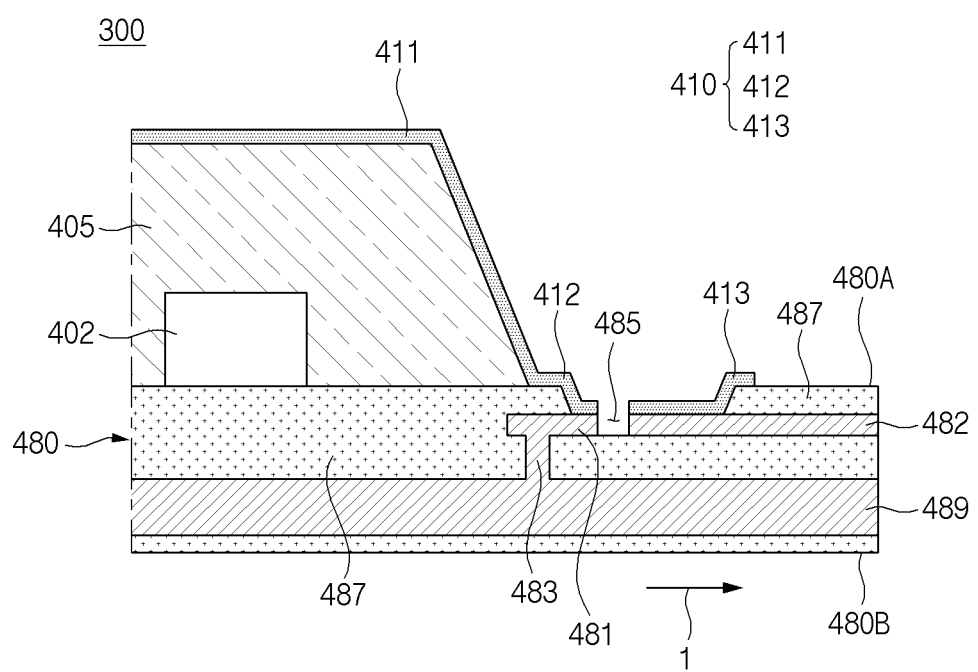
FIG. 4 is a cross-sectional view of a main part of a board of an electronic device according to an embodiment of the disclosure.

FIG. 4 is a cross-sectional view of a main part of a board of an electronic device according to an embodiment of the disclosure.

Referring to FIG. 4, the electronic device 300 according to the embodiment may include a board 480 (e.g., the printed circuit board 380 of FIG. 3), at least one electronic component 402, an insulation member 405, and a conductive layer 410.

According to an embodiment, the board 480 may include nonconductive portions 487 and conductive portions interposed between the nonconductive portions 487. In an embodiment, the nonconductive portion 487 may include a nonconductive material, for example, an epoxy resin and/or a phenol resin, but the disclosure is not limited by the above-described example. The conductive portions, for example, may include a first conductive line 481, a second conductive line 482, a conductive via hole 483, and a ground plane (or a ground area) 489 of the board 480. In an embodiment, the conductive via hole 483 may pass through the nonconductive portion 487 and may electrically connect the first conductive line 481 and the ground plane 489. In an embodiment, the second conductive line 482 may be electrically separated from the first conductive line 481. For example, because the second conductive line 482 is physically separated from the first conductive line 481 while an opening 485 formed in the board 480 being interposed therebetween, it may be electrically separated from the first conductive line 481. In an embodiment, the first conductive line 481, the second conductive line 482, the conductive via hole 483, and the ground plane 489, for example, may include copper that is a conductive metal, but the disclosure is not limited thereto.

In an embodiment, the board 480 may include a first surface 480A and a second surface 480B that faces an opposite direction to the first surface 480A. In an embodiment, various electronic components that are necessary for an operation of the electronic device 300 may be disposed on the first surface 480A and the second surface 480B of the board 480. For example, at least one electronic component 402 may be disposed on the first surface 480A of the board 480. The at least one electronic component 402, for example, may include at least one semiconductor element, a passive element, and/or a semiconductor chip that constitutes an integrated circuit. As another example, the at least one electronic component 402 may include at least one (e.g., a processor 1120 and a memory 1130) of the constituent elements illustrated in FIG. 11. In an embodiment, the at least one electronic component 402 may at least partially overlap the ground plane 489 when the first surface 480A of the board 480 is viewed.

In an embodiment, a thickness of the board 480, for example, may be about 350 μm, but the disclosure is not limited thereto.

In an embodiment, the insulation member 405 may be disposed (or formed) on the first surface 480A of the board 480 to surround the at least one electronic component 402. In an embodiment, the insulation member 405 may cover the at least one electronic component 402 three-dimensionally, and may protect the at least one electronic component 402 from an external environment (e.g., moisture, a physical impact, or heat).

In an embodiment, the conductive layer 410 may include a first part 411, a second part 412, and a third part 413.

In an embodiment, the first part 411 may be formed on a surface of the insulation member 405, and may surround the insulation member 405. In an embodiment, the second part 412 may extend from at least a portion of an edge of the first part 411. In an embodiment, the second part 412 may extend from the edge of the first part 411 in a direction (e.g., a first direction 1) that becomes farther away from the insulation member 405. In an embodiment, at least a portion of the second part 412 may be disposed on the first surface 480A of the board 480. For example, the second part 412 may be formed on the nonconductive portion 487 and the first conductive line 481 that form the first surface 480A of the board 480. In an embodiment, the second part 412 may contact the first conductive line 481 exposed through the first surface 480A of the board 480. In an embodiment, the second part 412 may be electrically connected to the first conductive line 481. In an embodiment, the second part 412 may be electrically connected to the ground plane 489 of the board 480, through the first conductive line 481 and the conductive via hole 483. In an embodiment, the first part 411 and the second part 412 of the conductive layer 410, and the ground plane 489 may provide electromagnetic interference (EMI) shielding to the at least one electronic component 402. Although FIG. 4 illustrates only a portion of the board 480, the shielding provided by the conductive layer 410 and the ground plane 489 may be implemented in a conformal shielding of surrounding all of six surfaces around the at least one electronic component 402.

In an embodiment, the third part 413 may be spaced apart from the second part 412. For example, the third part 413 may be spaced apart from the second part 412 while the opening 485 formed in the board 480 being interposed therebetween. In an embodiment, the third part 413 may be electrically separated from the second part 412. In an embodiment, the third part 413 may be spaced apart from the second part 412, and may extend in a direction (e.g., the first direction 1) that becomes farther away from the insulation member 405. In an embodiment, the third part 413 may be formed on the first surface 480A of the board 480. For example, the third part 413 may be formed on the second nonconductive line 482 and the nonconductive portion 487 that form the first surface 480A of the board 480. In an embodiment, the third part 413 may contact the second conductive line 482 exposed through the first surface 480A of the board 480. In an embodiment, the third part 413 may be electrically connected to the second conductive line 482. In an embodiment, the third part 413 and the second conductive line 482 may include a transmission line (e.g., at least one transmission line 910, which will be described below) for transmitting and receiving an electrical signal.

Although not illustrated, a first protection member for protecting the first conductive line 481 and the second conductive line 482 from an external environment may be filled in the opening 485 formed in the board 480. Although not illustrated, a second protection member that covers the third part 413 may be disposed to prevent an unintended short-circuit of the third part 413 constituted by the transmission line. The first protection member and the second protection member, for example, may include a liquid resin, but the disclosure is not limited thereto. The first protection member and the second protection member may be integrally formed in a form of being deposited on the opening 485 and the third part 413, but the disclosure is not limited thereto.

Figure 12:
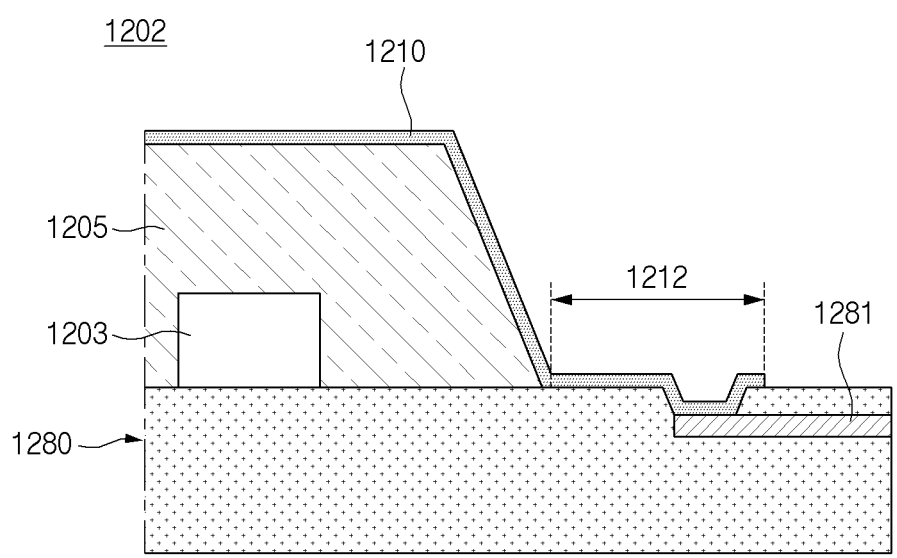
FIG. 12 is a cross-sectional view of a board according to the related art.

In the following, Table 1 represents EMI shielding performances of an electronic device (e.g., an electronic device 1202 of FIG. 12) according to a comparative example, and the electronic device 300 according to an embodiment.

TABLE 1

| Categories | E-Field @ 750 MHz [dBV/m] | | |
|---|---|---|---|
| | x-y average | z | Average |
| Comparative example | −200 | −200 | −200 |
| Embodiment of the disclosure | −200 | −200 | −200 |

Referring to Table 1, the shielding performance of the electronic device 300 according to the embodiment may be substantially the same as that of the electronic device according to the comparative example. In the electronic device (e.g., the electronic device 1202 of FIG. 12) according to the comparative example, a part 1212 of the conductive layer 1210 for grounding may have a first area. In contrast, the second part 412 of the conductive layer 410 of the electronic device 300 according to the embodiment may have a second area that is smaller than the first area. The electronic device 300 according to the embodiment may separate a part 1212 of the conductive layer 1210 of the electronic device (e.g., the electronic device 1202 of FIG. 12) according to the comparative example, and may utilized a portion thereof as an area for grounding (e.g., the second part 412 of the conductive layer 410), and utilize another portion thereof as a transmission line (e.g., the third part 413 of the conductive layer 410). Through this, the electronic device 300 according to the embodiment may save a mounting space of the board 480 and improve space utility while securing the required shielding performance.

Figure 5A:
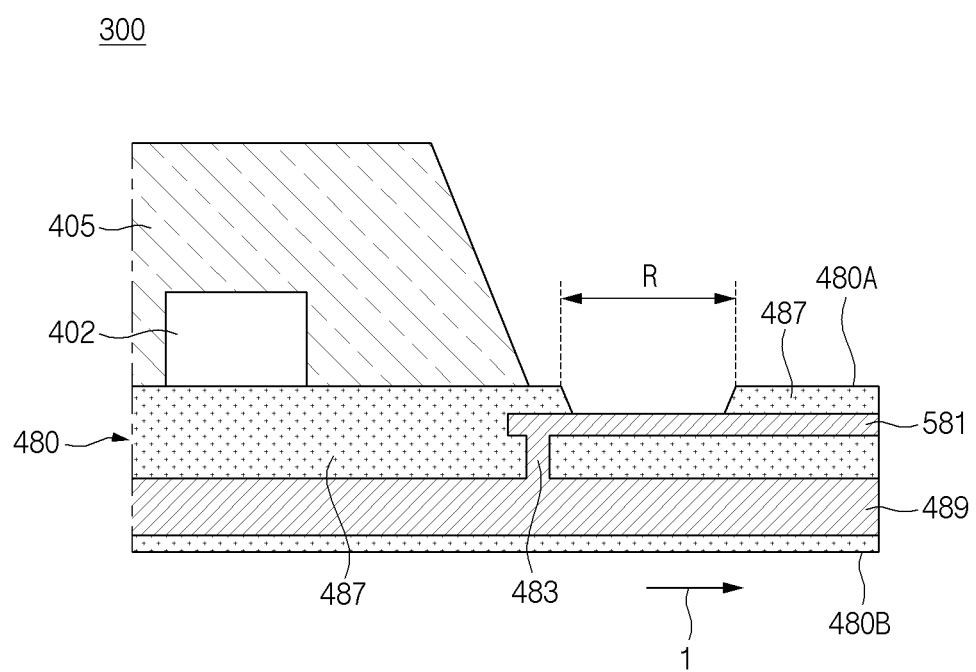
FIG. 5A is a cross-sectional view of a main part for illustrating a process of manufacturing a board according to an embodiment of the disclosure.

FIG. 5A is a cross-sectional view of a main part for illustrating a process of manufacturing a board according to an embodiment of the disclosure.

Figure 5B:
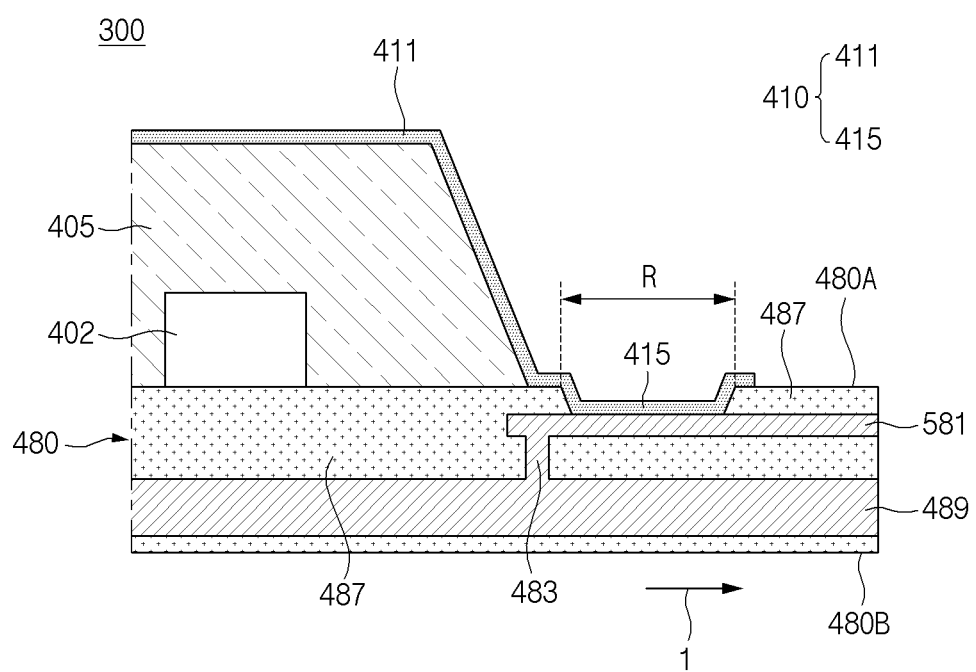
FIG. 5B is a cross-sectional view of a main part for illustrating a process of manufacturing a board according to an embodiment of the disclosure.

FIG. 5B is a cross-sectional view of a main part for illustrating a process of manufacturing a board according to an embodiment of the disclosure.

Figure 5C:
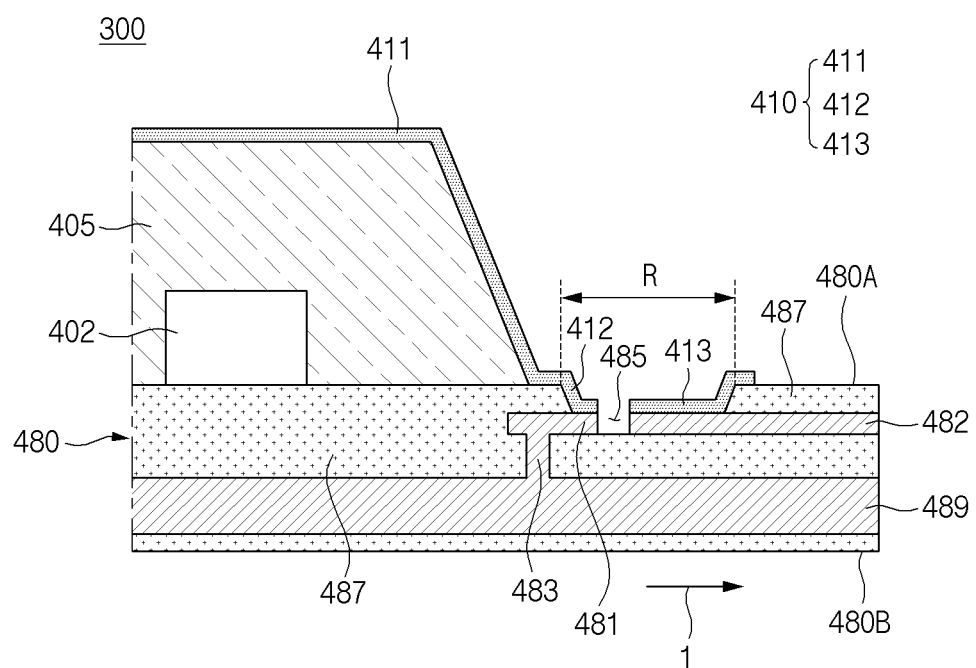
FIG. 5C is a cross-sectional view of a main part for illustrating a process of manufacturing a board according to an embodiment of the disclosure.

FIG. 5C is a cross-sectional view of a main part for illustrating a process of manufacturing a board according to an embodiment of the disclosure.

Hereinafter, a process of manufacturing the board 480 according to an embodiment will be described with reference to FIGS. 5A, 5B, and 5C. In the following detailed description, configurations that may be easily understood through the preceding embodiment will be endowed with the same reference numerals as those of the preceding embodiments or omitted, and a detailed description thereof will be omitted.

Referring to FIG. 5A, the board 480 including the conductive via hole 483 that electrically connects the nonconductive portion 487, the conductive line 581, the ground plate 489, and the conductive line 581, and the ground plate 489 may be provided. In an embodiment, the conductive line 581 may be partially exposed to the first surface 480A of the board 480 through a solder resist (SR) open area 'R'. In an embodiment, the SR open area 'R' may be an area, in which a solder resist deposited on the first surface 480A of the board 480 is removed.

In an embodiment, the insulation member 405 may be formed by injecting a molding resin onto the first surface 480A of the board 480 and curing the molding resin. The insulation member 405, for example, may include an epoxy-based forming resin and/or a polyimide-based forming resin. For example, the insulation member 405 may include an epoxy molding compound. However, the disclosure is not limited by the above-described example.

Referring to FIG. 5B, in an embodiment, the conductive layer 410 may be formed to cover the insulation member 405. The conductive layer 410 may include the first part 411 that covers a surface of the insulation member 405, and an extension part 415 that extends from the first surface 480A of the board 480 in a direction (e.g., the first direction 1) that becomes farther away from the insulation member 405 with respect to the edge of the first part 411. In an embodiment, the extension part 415 of the conductive layer 410 may extend to the nonconductive portion 487 via the SR open area 'R'. In an embodiment, the extension part 415 of the conductive layer 410 may be formed to cover the SR open area 'R', and may contact the conductive line 581.

In an embodiment, the conductive layer 410 may include a conductive material, for example, silver (Ag), copper (Cu), nickel (Ni), aluminum (Al), tin (Sn), stainless steel and/or a combination thereof, but the disclosure is not limited thereto. In an embodiment, the conductive layer 410 may be formed through a sputtering process or a spraying process, but the disclosure is not limited thereto. As another example, the conductive layer 410 may include a conductive film that is formed on a surface of the insulation member 405 and the first surface 480A of the board 480 in an attachment, adsorption, or thermal pressing method.

Referring to FIG. 5C, in an embodiment, the opening that partially passes through the board 480 may be formed. In an embodiment, the opening 485 may be formed in the SR open area 'R'. In an embodiment, the opening 485, for example, may be formed through laser machining, but the disclosure is not limited thereto. In an embodiment, the opening 485 may separate an extension part (e.g., the extension part 415 of FIG. 5B) of the conductive layer 410, and the conductive line 581. In an embodiment, the extension part (e.g., the extension part 415 of FIG. 5B) of the conductive layer 410 may be separated by the opening 485, and the second part 412 and the third part 413 of the conductive layer 410 may be formed. In an embodiment, the conductive line (e.g., the conductive line 581 of FIG. 5B) may be separated by the opening 485 to form the first conductive line 481 and the second conductive line 482.

In an embodiment, a diameter (or a width) of the opening 485 formed through laser cutting, for example, may be about 30 µm to 40 µm. As another example, the opening 485 may have a diameter of 40 µm or more (e.g., 100 µm) to prevent an unintended short-circuit. In an embodiment, a thickness of the conductive layer 410, for example, may be about 5 µm. In an embodiment, a thickness of the conductive line (e.g., the conductive line 581 of FIG. 5B), for example, may be about 12 µm. In this case, a depth of the opening 485 formed through laser cutting may be 17 µm or more. However, the disclosure is not limited by the above-described numerical example. In an embodiment, a size (e.g., a thickness, an area, a length, or a depth) of the first part 411 of the conductive layer 410, the second part 412 of the conductive layer 410, the first conductive line 481, the second conductive line 482, and/or the opening 485 may be selected according to the required shielding performance and/or the required performance of the transmission line.

Figure 6:
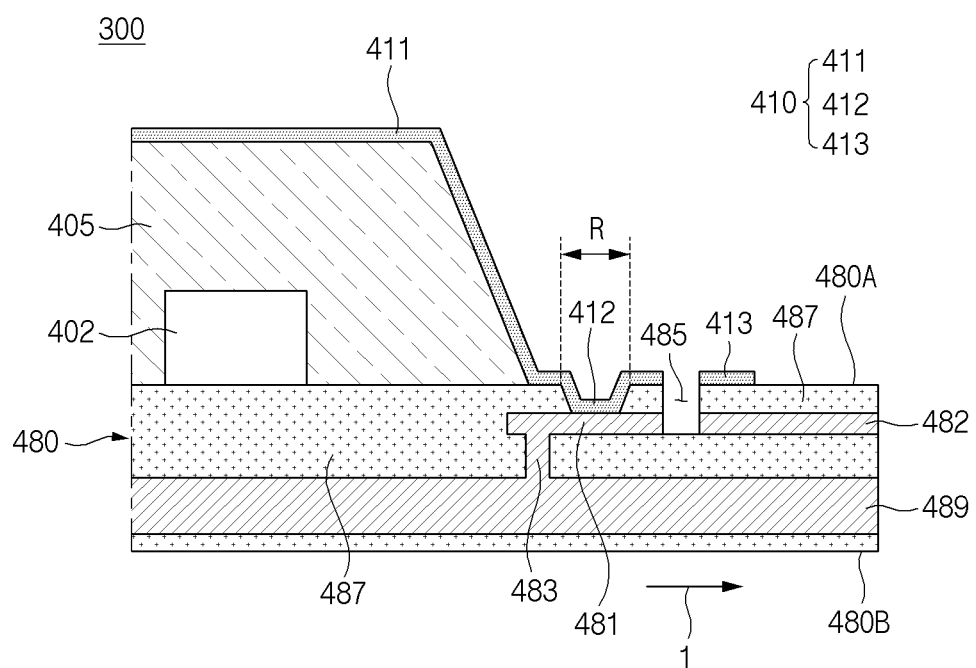
FIG. 6 is a cross-sectional view of a main part of a board of an electronic device according to an embodiment of the disclosure.

FIG. 6 is a cross-sectional view of a main part of a board of an electronic device according to an embodiment of the disclosure.

Hereinafter, only a difference from the embodiment illustrated in FIG. 4 will be described with reference to FIG. 6.

Referring to FIG. 6, in an embodiment, the opening 485 may be formed in an area other than the SR open area 'R'. For example, the opening 485 may be formed outside the SR open area 'R' (e.g., at a location spaced apart from the SR open area 'R' in the first direction). In this case, the opening 485 may pass through the extension part (e.g., the extension part 415 of FIG. 5B) of the conductive layer 410, the nonconductive portion 487 of the board 480, and the conductive line (e.g., the conductive line 581 of FIG. 5B). In an embodiment, the conductive line (e.g., the conductive line 581 of FIG. 5B) may be separated by the opening 485 to form the first conductive line 481 and the second conductive line 482. In an embodiment, the second part 412 of the conductive layer 410 may be electrically separated from the second conductive line 482 by the opening 485 and/or the nonconductive portion 487. In an embodiment, the third part 413 of the conductive layer 410 may be electrically separated from the second conductive line 482 by the nonconductive portion 487. In an embodiment, the second conductive line 482 may be utilized as a transmission line for transmitting an electrical signal.

Figure 7A:
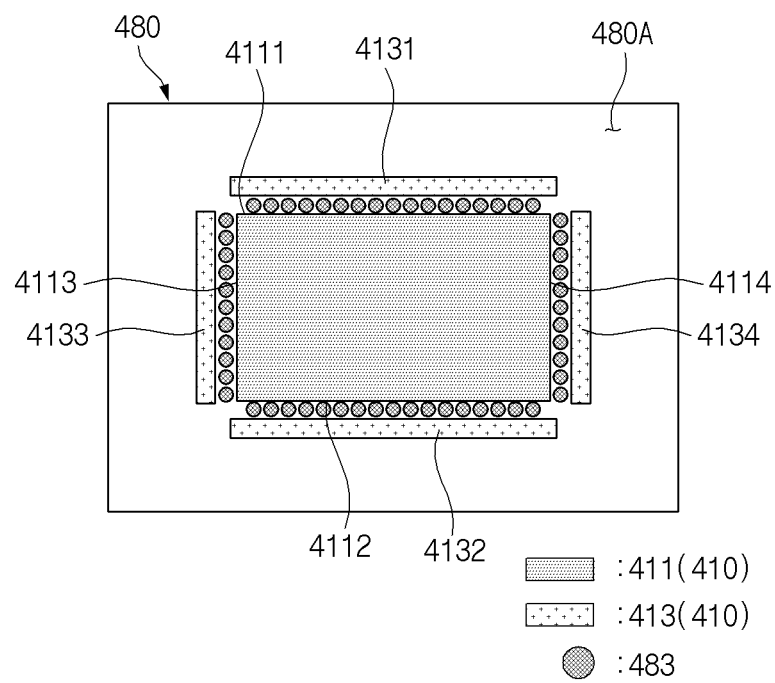
FIG. 7A is a view of a first surface of a board, viewed from a top, according to an embodiment of the disclosure.

FIG. 7A is a view of a first surface of a board, viewed from a top, according to an embodiment of the disclosure.

Figure 7B:
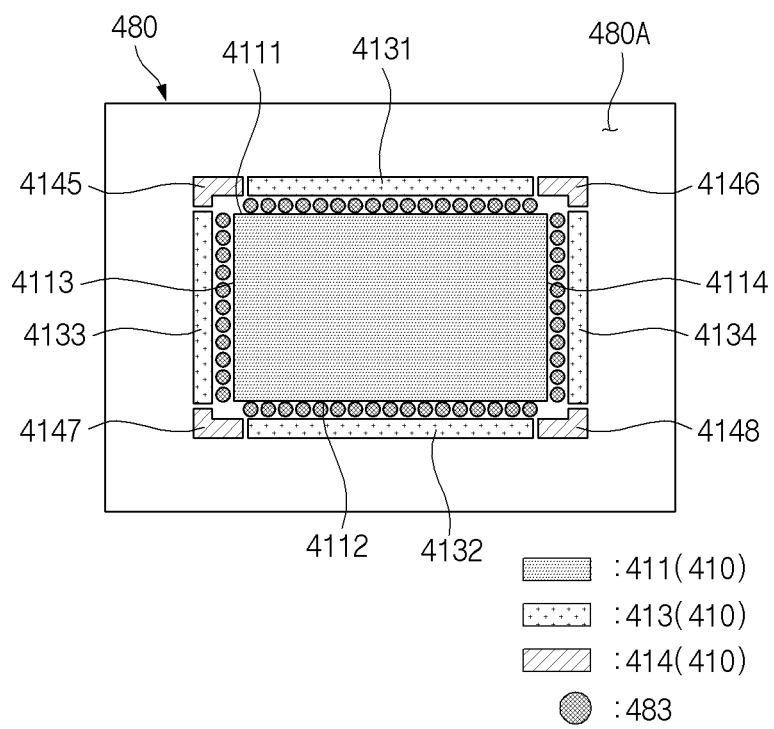
FIG. 7B is a view of a first surface of a board, viewed from a top, according to an embodiment of the disclosure.

FIG. 7B is a view of a first surface of a board, viewed from a top, according to an embodiment of the disclosure.

Figure 7C:
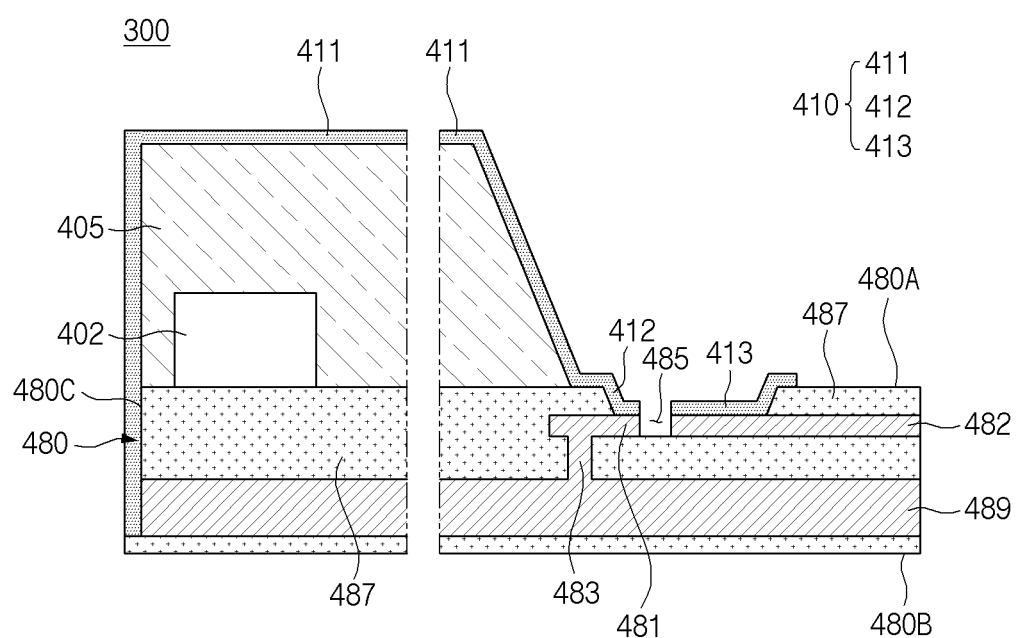
FIG. 7C is a cross-sectional view of a main part of a board according to an embodiment of the disclosure.

FIG. 7C is a cross-sectional view of a board according to an embodiment of the disclosure.

Referring to FIGS. 7A and 7B, illustration of the second part (e.g., the second part 412 of FIG. 4) of the conductive layer 410 electrically connected to the conductive via hole 483 is omitted for convenience of description. Although FIGS. 7A and 7B illustrate that the conductive via hole 483 is located outside the first part 411 of the conductive layer 410 (or the insulation member 405), the disclosure is not limited thereto, and at least a portion of the conductive via hole 483 may at least partially overlap the first part 411 of the conductive layer 410 (or the insulation member 405). A description of the first part 411 of the conductive layer 410, which will be provided below, also may be applied to the insulation member 405 in a substantially the same, or similar, or corresponding scheme, in that the first part 411 of the conductive layer 410 is at least partially formed along a surface of the insulation member 405 to have substantially the same or a similar outer shape.

Referring to FIG. 7A, the first part 411 of the conductive layer 410 may include a first edge 4111, a second edge 4112, a third edge 4113, and a fourth edge 4114.

In an embodiment, the first edge 4111 and the second edge 4112 may at least partially face each other. For example, the first edge 4111 and the second edge 4112 may be substantially parallel to each other while having substantially the same length, but the disclosure is not limited thereto. In an embodiment, the third edge 4113 may connect one end of the first edge 4111 and one end of the second edge 4112. In an embodiment, the fourth edge 4114 may connect an opposite end of the first edge 4111 and an opposite end of the second edge 4112. In an embodiment, the third edge 4113 and the fourth edge 4114 may at least partially face each other. For example, the third edge 4113 and the fourth edge 4114 may be substantially parallel to each other while having substantially the same length, but the disclosure is not limited thereto.

In an embodiment, the conductive via hole 483 may be disposed at least one edge of the first part 411 of the conductive layer 410. For example, the conductive via hole 483 may be disposed along the first to fourth edges 4111 to 4114 of the first part 411 of the conductive layer 410. As another example, referring to FIG. 7C, an adjacent conductive via hole may not be disposed at any one edge 4115 of the first part 411 of the conductive layer 410. In this case, any one edge 4115 of the conductive layer 410 may extend along a side surface 480C of the board 480, and may be electrically connected to the ground plane 489.

Referring to FIG. 7A, in an embodiment, the first part 411 of the conductive layer 410 may be electrically connected to the ground plane (not illustrated) (e.g., the ground plane 489 of FIG. 4) of the board 480 through the second part (not illustrated) (e.g., the second part 412 of FIG. 4) extending from the first part 411 of the conductive layer 410 and the conductive via hole 483 electrically connected to the second part.

In an embodiment, the third part 413 may be disposed along at least some of the edges of the first part 411 of the conductive layer 410. For example, the third part 413 may include a first area 4131 that is adjacent to the first edge 4111, a second area 4132 that is adjacent to the second edge 4112, a third area 4133 that is adjacent to the third edge 4113, and a fourth area 4134 that is adjacent to the fourth edge 4114. In an embodiment, the third part 413 of the conductive layer 410 may constitute a transmission line together with the second conductive line (not illustrated) (e.g., the second conductive line 482 of FIG. 4) electrically connected to the third part 413.

In another embodiment, referring to FIG. 7B, the conductive layer 410 may further include the fourth part 414. In an embodiment, the fourth part 414 may extend from at least one corner of the first part 411 of the conductive layer 410. For example, the fourth part 414 of the conductive layer 410 may extend from the first part 411. As another example, the fourth part 414 of the conductive layer 410 may be connected to the first part 411 through the second part (not illustrated) (e.g., the second part 412 of FIG. 4). As another example, an extension part (e.g., the extension part 415 of FIG. 5B) of the fourth part 414 of the conductive layer 410, which extends from the first part 411, may include a portion, which is not separated through laser machining.

In an embodiment, the fourth part 414 may include at least one of a fifth area 4145 that is adjacent to the first area 4131 and the third area 4133 of the third part 413, a sixth area 4146 that is adjacent to the first area 4131 and the fourth area 4134 of the third part 413, a seventh area 4147 that is adjacent to the second area 4132 and the third area 4133 of the third part 413, and an eighth area 4148 that is adjacent to the second area 4132 and the fourth area 4134 of the third part 413.

In an embodiment, the fourth part 4134 may be electrically connected to the ground plane of the board 480 through another conductive line that is distinguished from the first conductive line 481 and the second conductive line 482. For example, the fourth part 414 may be directly connected to the ground plane through the other conductive line. As another example, the other conductive line may be electrically connected to the first conductive line (e.g., the first conductive line 481 of FIG. 4) and the conductive via hole 483 and thus the fourth part 414 of the conductive layer 410 may be electrically connected to the ground plane 489 of the board 480. As another example, the fourth part 414 may be electrically connected to the ground plane of the board 480 in a scheme illustrated in FIG. 12.

As illustrated in FIG. 7B, according to an embodiment, through the fourth part 414 disposed at a corner portion of the first part 411 of the conductive layer 410, an EMI shielding performance of the electronic component (e.g., the at least one electronic component 402 of FIG. 4) disposed in the board 480 may be improved. For example, the fourth part 414 of the conductive layer 410 may prevent noise that may be induced to or from the corner portion.

Figure 8A:
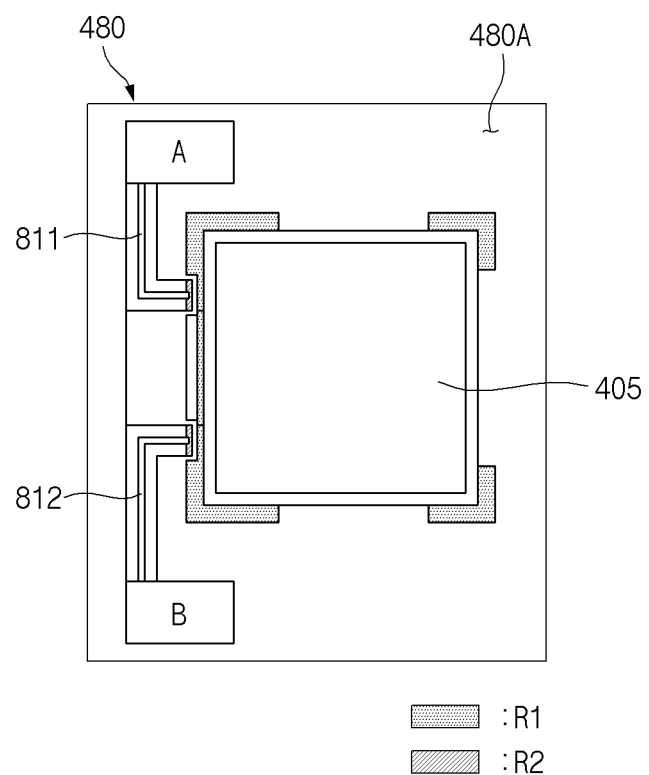
FIG. 8A is a view illustrating a manufacturing process for using a third part of a conductive layer as a power line according to an embodiment of the disclosure.

FIG. 8A is a view illustrating a manufacturing process for using a third part of a conductive layer as a power line according to an embodiment of the disclosure.

Figure 8B:
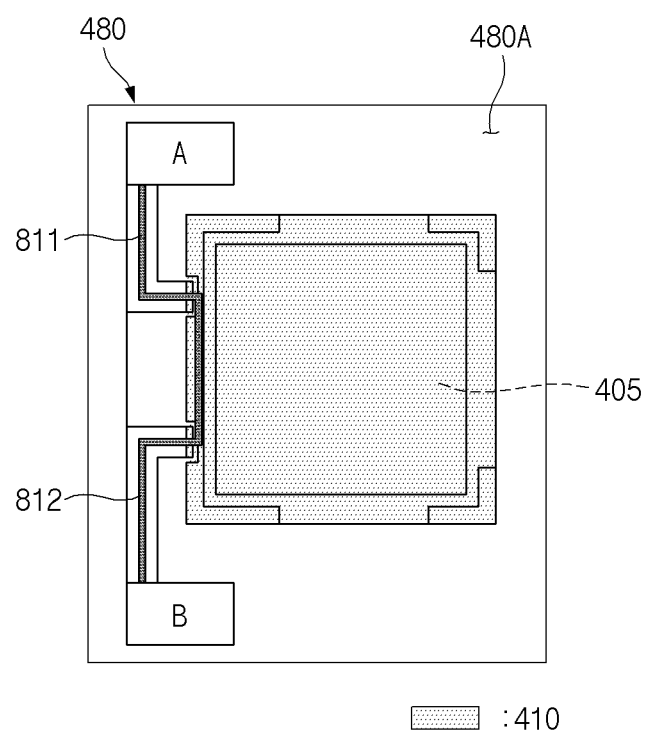
FIG. 8B is a view illustrating a manufacturing process for using a third part of a conductive layer as a power line according to an embodiment of the disclosure.

FIG. 8B is a view illustrating a manufacturing process for using a third part of a conductive layer as a power line according to an embodiment of the disclosure.

Figure 8C:
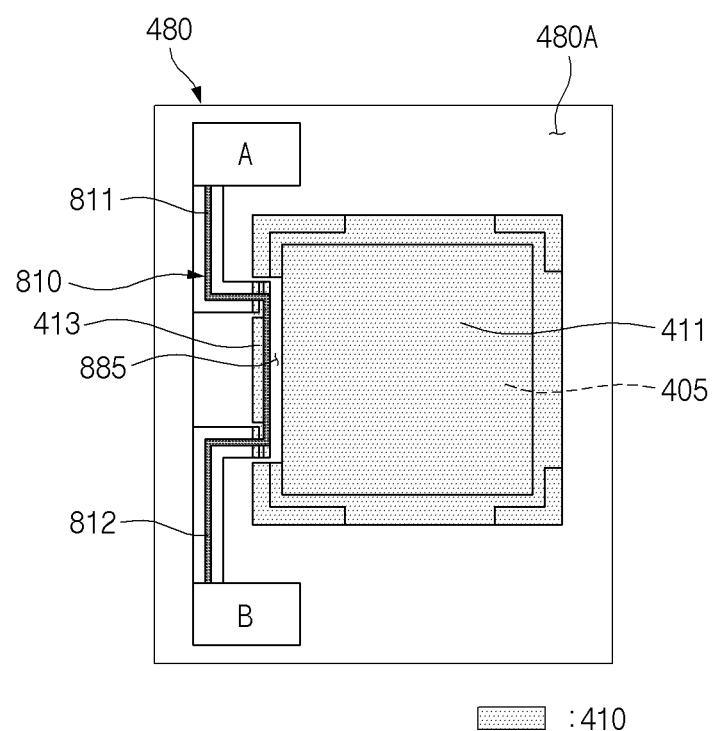
FIG. 8C is a view illustrating a manufacturing process for using a third part of a conductive layer as a power line according to an embodiment of the disclosure.

FIG. 8C is a view illustrating a manufacturing process for using a third part of a conductive layer as a power line according to an embodiment of the disclosure.

Referring to FIG. 8A, the electronic device 300 according to an embodiment may include a first device 'A' and a second device 'B' disposed in the board 480. In an embodiment, the first device 'A' and the second device 'B' may be located outside the insulation member 405 (or the conductive layer 410). For example, the first device 'A' and/or the second device 'B' may be disposed on the first surface 480A and/or the second surface (e.g., the second surface 480B of FIG. 4) of the board 480, outside the insulation member 405 (or the conductive layer 410).

In an embodiment, the first device 'A' may include a first wring line 811, and the second device 'B' may include a second line 812. In an embodiment, the first line 811 of the first device 'A' and the second line 812 of the second device 'B' may extend toward a first SR open area R1 (e.g., the SR open area 'R' of FIG. 5A) formed on the first surface 480A of the board 480. In an embodiment, the first line 811 and the second line 812 may be partially exposed through a second SR open area R2 formed on the first surface 480A of the board 480. In an embodiment, the first line 811 and the second line 812 may not be electrically connected to the second SR open area R2 connected to the ground plane (not illustrated) (e.g., the ground plane 489 of FIG. 4) of the board 480.

Referring to FIG. 8B, in an embodiment, the conductive layer 410 may be formed to cover the insulation member 405, the first SR open area R1, and the second SR open area R2. Through the conductive layer 410, the first line 811, the second line 812, and the ground plane (not illustrated) of the board 480 may be electrically connected to each other.

Referring to FIG. 8C, in an embodiment, laser machining may be performed along a designated path. Through the laser machining, an opening 885 (e.g., the opening 485 of FIG. 4) that partially passes through the board 480 may be formed. In an embodiment, by the opening 885, a power line 810 may be electrically and physically separated from the first part 411 and the second part (not illustrated) of the conductive layer 410. In an embodiment, the first line 811 of the first device 'A' and the second line 812 of the second device 'B' may be electrically connected to each other through the third part 413 of the conductive layer 410. Through this, the power line 810 that connects the first device 'A' and the second device 'B' may be formed. In an embodiment, through the power line 810, a power signal may be delivered between the first device 'A' and the second device 'B'.

Figure 9A:
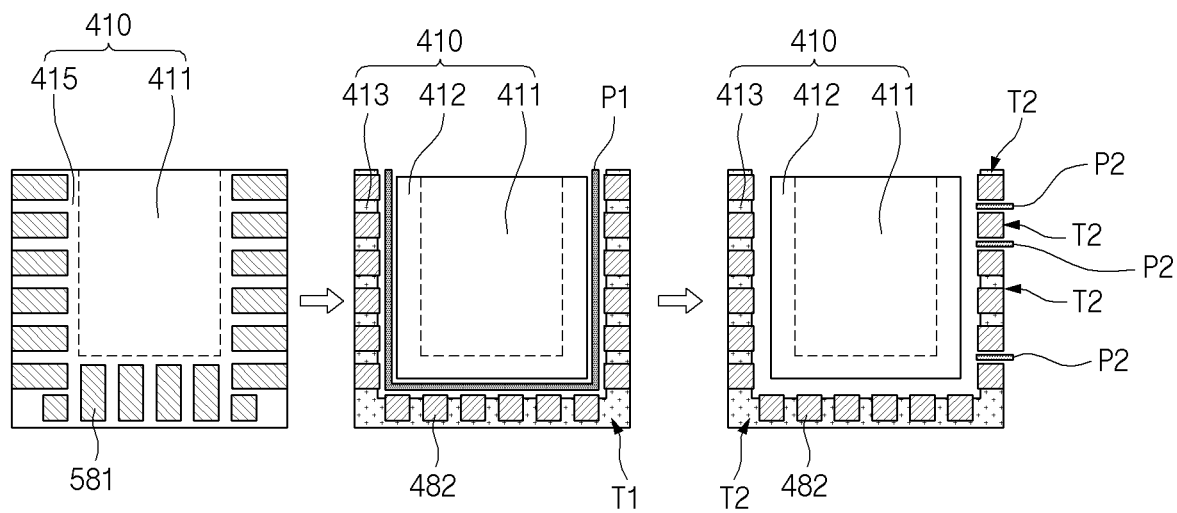
FIG. 9A is a view illustrating a process of manufacturing a transmission line in various forms according to an embodiment of the disclosure.

FIG. 9A is a view illustrating a process of manufacturing a transmission line in various forms according to an embodiment of the disclosure.

Figure 9B:
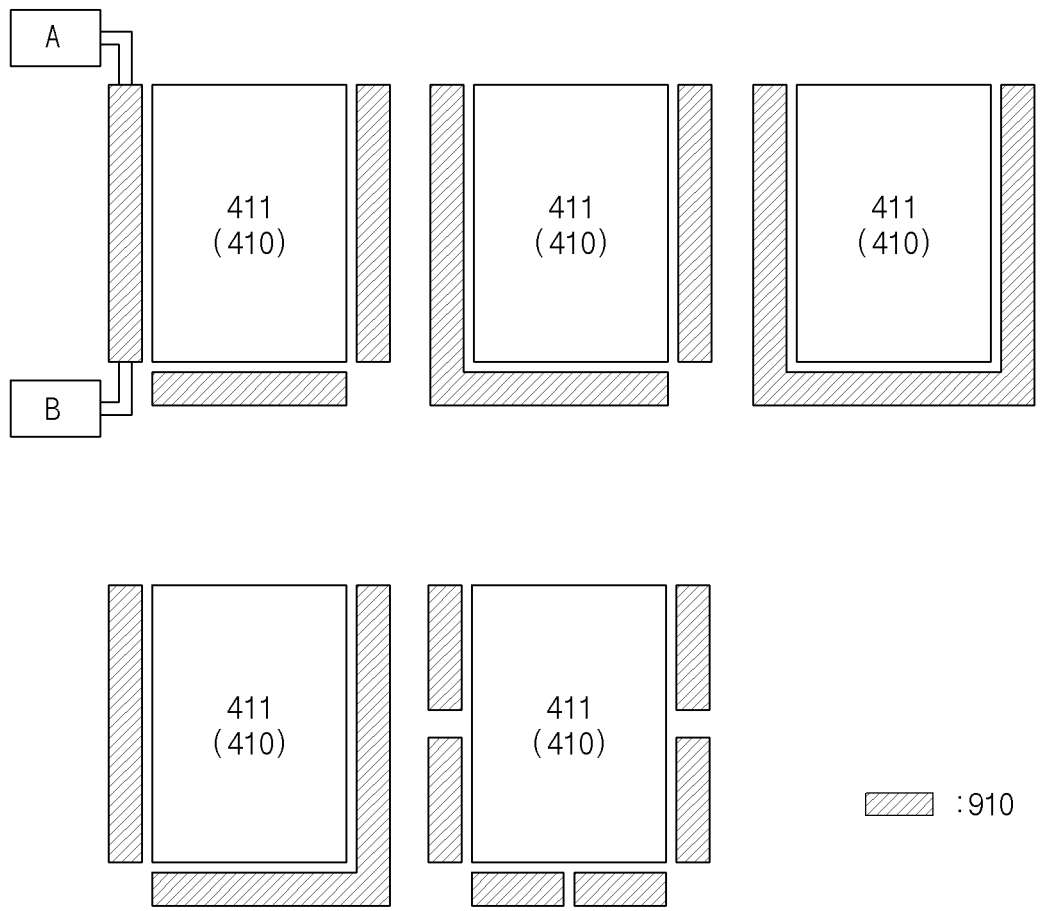
FIG. 9B illustrates examples of transmission lines formed in a board according to an embodiment of the disclosure.

FIG. 9B illustrates examples of transmission lines formed in a board according to an embodiment of the disclosure.

Figure 10A:
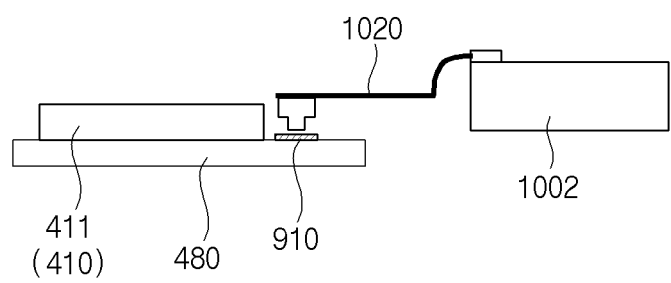
FIG. 10A is a view illustrating an example of utilizing a transmission line formed in a board as a first contact structure according to an embodiment of the disclosure.

FIG. 10A is a view illustrating an example of utilizing a transmission line formed in a board as a first contact structure according to an embodiment of the disclosure.

Figure 10B:
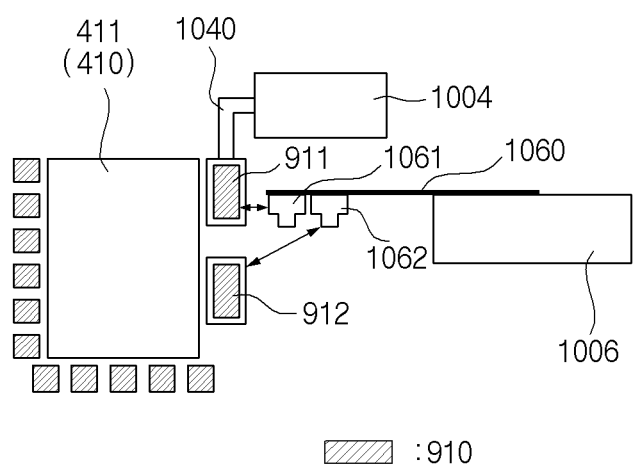
FIG. 10B is a view illustrating an example of utilizing a transmission line formed in a board as a second contact structure according to an embodiment of the disclosure.

FIG. 10B is a view illustrating an example of utilizing a transmission line formed in a board as a second contact structure according to an embodiment of the disclosure.

Figure 10C:
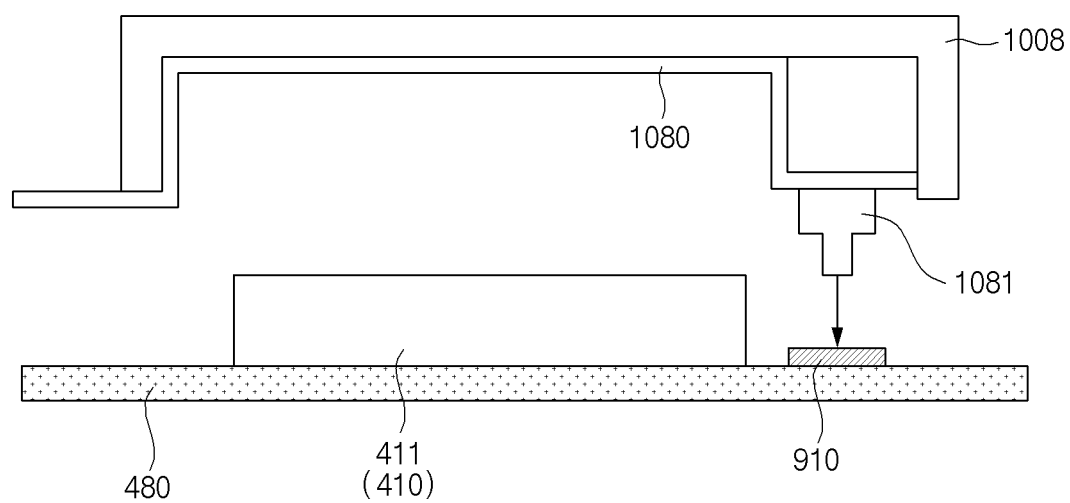
FIG. 10C is a view illustrating an example of utilizing a transmission line formed in a board as a third contact structure according to an embodiment of the disclosure.

FIG. 10C is a view illustrating an example of utilizing a transmission line formed in a board as a third contact structure according to an embodiment of the disclosure.

Referring to FIG. 9A, in an embodiment, the board 480 including the conductive line 581 and the conductive layer 410 may be provided. In an embodiment, the conductive layer 410 may include the extension part 415 that covers the first part 411 and the conductive line 581. In an embodiment, primary laser machining may be performed along a first path P1 of the board 480. In an embodiment, the first path P1 may be a path in a direction that is substantially parallel to a direction, in which an edge of the first part 411 (or the second part 412) of the conductive layer 410 extends. Through the primary laser machining, an opening (e.g., the opening 485 of FIG. 4) may be formed. The conductive line 581 may be separated by the first opening and thus the first conductive line (not illustrated) (e.g., the first conductive line 481 of FIG. 4) and the second conductive line 482 may be formed. The extension part 415 of the conductive layer 410 may be separated by the first opening, and thus the second part 412 and the third part 413 of the conductive layer 410 may be formed. In an embodiment, the third part 413 of the conductive layer 410 may constitute a first transmission line T1 together with the second conductive line 482. In an embodiment, secondary laser machining for separating the first transmission line T1 along a second path P2 may be performed. For example, the second path P2 may be a path in a direction that is substantially perpendicular to a direction, in which an edge of the first part 411 (or the second part 412) of the conductive layer 410 extends. In an embodiment, a second opening may be formed through the secondary laser machining. In an embodiment, by the second opening, the first transmission line T1 constituted by the third part 413 of the conductive layer 410 and the second conductive line 482 may be separated. In an embodiment, second transmission lines T2 separated from each other by the second opening may be formed.

In an embodiment, according to a purpose and/or an objective of a part utilized as a transmission line, laser machining may be performed at least once, and through this, the number, a thickness, and/or an area of parts utilized as transmission lines may be adjusted. For example, referring to FIG. 9B, at least one transmission line 910 may be formed along at least a portion of an edge of the first part 411 of the conductive layer 410. In an embodiment, the at least one transmission line 910 may be configured to transmit an electrical signal such as a power signal or a radio frequency (RF) signal. In an embodiment, a shape of the at least one transmission line 910 is not limited to the illustrated embodiment, and may be variously determined according to a function, a location, a shape, and/or a size of the device (e.g., the first device 'A' and the second device 'B').

In another embodiment, referring to FIG. 10A, at least one transmission line 910 may be constituted in a first contact structure, by which another constituent element (or another electronic component) 1002 is to be electrically connected to the board 480. The electronic device according to an embodiment may include another constituent element (or another electronic component) 1002, which is distinguished from at least one electronic component (e.g., the at least one electronic component 402 of FIG. 4), and a connection member 1020.

In an embodiment, the other constituent element 1002 may be electrically connected to at least one transmission line 910 through the connection member 1020 (e.g., a flexible printed circuit board). For example, the at least one transmission line 910 may be connected to contact points provided in the connection member 1020. For example, the first contact structure may include a first connector (e.g., a receptacle) disposed in the board 480 to be electrically connected to the at least one transmission line 910, and a second connector (e.g., a plug) provided in the connection member 1020 to be coupled to the first connector. In an embodiment, the other constituent element 1002 may be electrically connected to the board 480 (or the at least one transmission line 910) through the connection member 1020, the first connector, and the second connector. In an embodiment, the other constituent element 1002, for example, may include at least one of a battery, a key button, and/or a switch.

In another embodiment, referring to FIG. 10B, the at least one transmission line 910 may be constituted in a second contact structure for operatively connecting a plurality of constituent elements. The electronic device according to an embodiment may include a first constituent element (or the first electronic component) 1004 and a second constituent element (or the second electronic component) 1006, which are distinguished from at least one electronic component 402 (e.g., the at least one electronic component 402 of FIG. 4). The electronic device according to an embodiment may include a first connection member 1040 and a second connection member 1060. The at least one transmission line 910 according to an embodiment may include a first transmission line 911 and a second transmission line 912. In an embodiment, the first constituent element 1004 may be electrically connected to the first transmission line 911 through the first connection member 1040. In an embodiment, the second constituent element 1006 may be electrically connected to the first transmission line 911 and the second transmission line 912 through the second connection member 1060. For example, the second constituent element 1006 may be electrically connected to the first transmission line 911 through a first connector (or a first terminal) 1061 of the second connection member 1060, and may be electrically connected to the second transmission line 912 through a second connector (or a second terminal) 1062 of the second connection member 1060. In an embodiment, the second constituent element 1006 may be electrically connected to the first constituent element 1004 through the first transmission line 911, and may be electrically connected to the ground plane (not illustrated) (e.g., the ground plane 489 of FIG. 4) of the board through the second transmission line 912. In an embodiment, the second constituent element 1006, for example, may include a battery (e.g., the battery 1189 of FIG. 11) for supplying electric power that is necessary for the electronic device, and the first constituent element 1004 may include a power management module (e.g., a power management module 1188 of FIG. 11) for managing the battery. In an embodiment, when the first constituent element 1004 is disposed in the board (e.g., the board 480 of FIG. 4), in which the conductive layer 410 is located, the first connection member 1040 may be understood as including the conductive line formed in the board. In an embodiment, the second connection member 1060, for example, may include a flexible circuit board or a rigid-flexible printed circuit board.

In another embodiment, referring to FIG. 10C, the at least one transmission line 910 may be constituted in a third contact structure using a mechanical structure. For example, the mechanical structure 1008 may include a structure that supports a configuration (e.g., the board 480) of the electronic device or at least partially forms a frame and/or an external shape of the electronic device, together with the bracket (e.g., the support member 360 of FIG. 3) and/or the housing (e.g., the side bezel structure 310 of FIG. 3) of the electronic device. In an embodiment, a third connection member 1080 provided with a connector 1081 at an end thereof may be disposed on one side of the mechanical structure 1008. In an embodiment, the third connection member 1030 may be disposed between the mechanical structure 1008 and the board 480 (or the conductive layer 410 disposed in the board 480). In an embodiment, while the mechanical structure 1008 is disposed on the board 480 (or the mechanical structure 1008 and the board 480 are assembled or coupled to each other), the connector 1081 and the at least one transmission line 910 may be electrically connected to each other. Although not illustrated, through the third connection member 1080, a constituent element (or an electronic component) that is distinguished from the at least one electronic component (e.g., the at least one electronic component 402 of FIG. 4) may be electrically connected to the at least one transmission line 910.

The electronic device (e.g., the electronic device 300 of FIG. 4) according to the above-described embodiment may include a board (e.g., the board 480 of FIG. 4) including a first conductive line (e.g., the first conductive line 481 of FIG. 4), a second conductive line (e.g., the second conductive line 482 of FIG. 4) spaced apart from the first conductive line, a ground plane (e.g., the ground plane 489 of FIG. 4), and a conductive via hole (e.g., the conductive via hole 483 of FIG. 4) electrically connecting the first conductive line and the ground plane, at least one electronic component (e.g., at least one electronic component 402 of FIG. 4) disposed on a first surface (e.g., the first surface 480A of FIG. 4) of the board to at least partially overlap the ground plane, an insulation member (e.g., the insulation member 405 of FIG. 4) covering the at least one electronic component, and a conductive layer (e.g., the conductive layer 410 of FIG. 4), the conductive layer may include a first part (e.g., the first part 411 of FIG. 4) formed on a surface of the insulation member, a second part (e.g., the second part 412 of FIG. 4) formed on the first surface of the board to extend from at least a portion of an edge of the first part in a direction (e.g., the first direction 1 of FIG. 4) that becomes farther away from the insulation member, and electrically connected to the first conductive line, and a third part (e.g., the third part 413 of FIG. 4) spaced apart from the second part, extending from the first surface of the board in a direction that becomes farther away from the insulation member, and electrically connected to the second conductive line, the first conductive line and the second part of the conductive layer may be spaced apart from the second conductive line and the third part of the conductive layer while an opening (e.g., the opening 485 of FIG. 4) formed in the board being interposed therebetween, and the electronic device may include at least one transmission line (e.g., the at least one transmission line 910 of FIG. 9B) including the second conductive line and the third part of the conductive layer that transmit an electrical signal.

In an embodiment, at portion of the first conductive line may be exposed through the first surface of the board, and the second part of the conductive layer may contact the portion of the first conductive line.

In an embodiment, at portion of the second conductive line may be exposed through the first surface of the board, and the third part of the conductive layer may contact the portion of the second conductive line.

In an embodiment, the first conductive line is partially exposed to the first surface of the board through a solder resist (SR) open area in which a solder resist deposited on the first surface of the board is removed.

In an embodiment, a portion of the first conductive line may be exposed through the first surface of the board, the exposed portion of the first conductive line may contact the second part of the conductive layer, a portion of the second conductive line may be exposed through the first surface of the board, the exposed portion of the second conductive line may contact the third part of the conductive layer, and the opening may be formed between the portion of the first conductive line and the portion of the second conductive line.

In an embodiment, the first part of the conductive layer may include a first edge (e.g., the first edge 4111 of FIG. 7A), a second edge (e.g., the second edge 4112 of FIG. 7A) that at least partially faces the first edge, a third edge (e.g., the third edge 4113 of FIG. 7A) connecting one end of the first edge and one end of the second edge, and a fourth edge (e.g., the fourth edge 4114 of FIG. 7A) that connects an opposite end of the first edge and an opposite end of the second edge and at least partially faces the third edge, and the first edge, the second edge, the third edge, or the fourth edge may extend along a surface of the insulation member and a side surface (e.g., the side surface 480C of FIG. 7C) of the board and may be electrically connected to the ground plane of the board.

In an embodiment, the first part of the conductive layer may include a first edge (e.g., the first edge 4111 of FIG. 7A), a second edge (e.g., the second edge 4112 of FIG. 7A) that at least partially faces the first edge, a third edge (e.g., the third edge 4113 of FIG. 7A) connecting one end of the first edge and one end of the second edge, and a fourth edge (e.g., the fourth edge 4114 of FIG. 7A) that connects an opposite end of the first edge and an opposite end of the second edge and at least partially faces the third edge, the third part of the conductive layer may include a first area (e.g., the first area 4131 of FIG. 7A) that extends along the first edge, a second area (e.g., the second area 4132 of FIG. 7A) that extends along the second edge, a third area (e.g., the third area 4133 of FIG. 7A) that extends along the third edge, and a fourth area (e.g., the fourth area 4134 of FIG. 7A) that extends along the fourth edge, and the first area, the second area, the third area, and the fourth area may be electrically connected to the second conductive line and may constitute the at least one transmission line.

In an embodiment, the board may further include another conductive line that is distinguished from the first conductive line and the second conductive line, the conductive layer may include a fourth part (e.g., the fourth part 414 of FIG. 7B) that extends from at least one corner of the first part, the fourth part of the conductive layer may include at least one of a fifth area (e.g., the fifth area 4145 of FIG. 7B) that is adjacent to the first area and the third area of the third part, a sixth area (e.g., the six area 4146 of FIG. 7B) that is adjacent to the first area and the fourth area of the third part, a seventh area (e.g., the seventh area 4147 of FIG. 7B) that is adjacent to the second area and the third area of the third part, and an eighth area (e.g., the eighth area 4148 of FIG. 7B) that is adjacent to the second area and the fourth area of the second part, and the at least one of the fifth area, the sixth area, the seventh area, or the eighth area may be electrically connected to the ground plane of the board, through the other conductive line of the board.

In an embodiment, a first device (e.g., the first device 'A' of FIG. 8C) and a second device (e.g., the second device 'B' of FIG. 8C) disposed on the first surface of the board and/or the second surface (e.g., the second surface 480B of FIG. 4) that faces an opposite direction to the first surface, the first device and the second device may be located outside the insulation member and may be electrically connected to each other through the at least one transmission line (e.g., the power line 810 of FIG. 8C), and the at least one transmission line may be configured to transmit a power signal between the first device and the second device.

In an embodiment, an opening configured to partially pass through the board is formed by laser machining such that a power line is electrically and physically separated from the first part and the second part of the conductive layer, the power line electrically connecting the first device and the second device.

In an embodiment, the opening may include a first opening (e.g., the first opening formed along the first path P1 of FIG. 9A) and a second opening (e.g., the second opening formed along the second path P2), the first opening may be formed in a direction (e.g., the direction of the first path P1 of FIG. 9A) that is substantially parallel to a direction, in which an edge of the first part of the conductive layer extends, the second opening may be formed along a direction (e.g., the direction of the second path P2 of FIG. 9A) that is substantially perpendicular to the direction, in which the edge of the first part of the conductive layer extends, and the at least one transmission line (e.g., the first transmission line T1 and/or the second transmission line T2 of FIG. 9A) may be formed by the first opening and the second opening.

The electronic device according to an embodiment may include another electronic component (e.g., the other constituent element 1002 of FIG. 10A) that is distinguished from the at least one electronic component, a connection member (e.g., the connection member 1020 of FIG. 10A) for electrically connecting the other electronic component and the board, a first connector disposed in the board to be electrically connected to the at least one transmission line, and a second connector disposed in the connection member, and electrically physically coupled to the first connector, and the other electronic component may be electrically connected to the at least one transmission line through the connection member, the first connector, and the second connector.

In an embodiment, the other electronic component may include a battery (e.g., the battery 370 of FIG. 3) or a key button switch (e.g., the key input device 102 and 103 of FIG. 1).

The electronic device according to an embodiment may include a first electronic component (e.g., the first constituent element 1004 of FIG. 10B) and a second electronic component (e.g., the second constituent element 1006 of FIG. 10B) that are distinguished from the at least one electronic component, a first connection member (e.g., the first connection member 1040 of FIG. 10B) that electrically connects the first electronic component and a first transmission line (e.g., the first transmission line 911 of FIG. 10B) of the at least one transmission line, and a second connection member (e.g., the second connection member 1060 of FIG. 10B) that electrically connects the first transmission line and a second transmission line (e.g., the second transmission line 912 of FIG. 10B) of the at least one transmission line to the second electronic component, and the second electronic component may be electrically connected to the first electronic component through the first transmission line, and may be electrically connected to the ground plane of the board through the second transmission line.

In an embodiment, the second electronic component may include a battery (e.g., the battery 1189 of FIG. 11) for providing electric power that is necessary for an operation of the electronic device, and the first electronic component may include a power management circuit (e.g., the power management module 1188 of FIG. 11) for managing the battery.

In an embodiment, the first electronic component may be disposed in the board, the first connection member may include a conductive pattern formed in the board, and the second connection member may include a flexible printed circuit board or a rigid-flexible printed circuit board.

The electronic device according to an embodiment may include a mechanical structure (e.g., the mechanical structure 1008 of FIG. 10C) that supports the board, a third connection member (e.g., the third connection member 1080 of FIG. 10C) disposed between the board and the mechanical structure, and an electronic component that is distinguished from the at least one electronic component and is electrically connected to the at least one transmission line through the third connection member, and the electronic component may be electrically connected to the at least one transmission line while the mechanical structure and the board are coupled to each other.

The board (e.g., the board 480 of FIG. 4) of the electronic device (e.g., the electronic device 300 of FIG. 4) according to the above-described embodiment may include a first conductive line (e.g., the first conductive line 481 of FIG. 4), a second conductive line (e.g., the second conductive line 482 of FIG. 4) spaced apart from the first conductive line, a ground plane (e.g., the ground plane 489 of FIG. 4), a conductive via hole (e.g., the conductive via hole 483 of FIG. 4) that electrically connects the first conductive line and the ground plane, at least one electronic component (e.g., the at least one electronic component 402 of FIG. 4) disposed on the first surface (e.g., the first surface 480A of FIG. 4) of the board to at least partially overlap the ground plane, an insulation member (e.g., the insulation member 405 of FIG. 4) that covers the at least one electronic component, and a conductive layer (e.g., the conductive layer 410 of FIG. 4), the conductive layer may include a first part (e.g., the first part 411 of FIG. 4) formed on a surface of the insulation member, a second part (e.g., the second part 412 of FIG. 4) formed on the first surface of the board to extend in a direction (e.g., the first direction 1 of FIG. 4) that becomes farther away from the insulation member with respect to at least portion of the edge of the first part, and electrically connected to the first conductive line, and a third part (e.g., the third part 413 of FIG. 4) spaced apart from the second part, extending from the first surface of the board in a direction that becomes farther away from the insulation member, and electrically connected to the second conductive line, the first conductive line and the second part of the conductive layer may be spaced apart from the second conductive line and the third part of the conductive layer while an opening (e.g., the opening 485 of FIG. 4) formed in the board being interposed therebetween, and the board may include at least one transmission line (e.g., the at least one transmission line 910 of FIG. 9B) constituted by the second conductive line and the third part of the conductive layer that transmit an electrical signal.

In an embodiment, at portion of the first conductive line may be exposed through the first surface of the board, and the second part of the conductive layer may contact the portion of the first conductive line.

In an embodiment, at portion of the second conductive line may be exposed through the first surface of the board, and the third part of the conductive layer may contact the portion of the second conductive line.

In an embodiment, the opening may be formed between the portion of the first conductive line and the portion of the second conductive line.

In an embodiment, a first device (e.g., the first device 'A' of FIG. 8C) and a second device (e.g., the second device 'B' of FIG. 8C) disposed on the first surface of the board and/or the second surface (e.g., the second surface 480B of FIG. 4)

that faces an opposite direction to the first surface, the first device and the second device may be located outside the insulation member and may be electrically connected to each other through the at least one transmission line, and the at least one transmission line (e.g., the power line 810 of FIG. 8C) may be configured to transmit a power signal between the first device and the second device.

Figure 11:
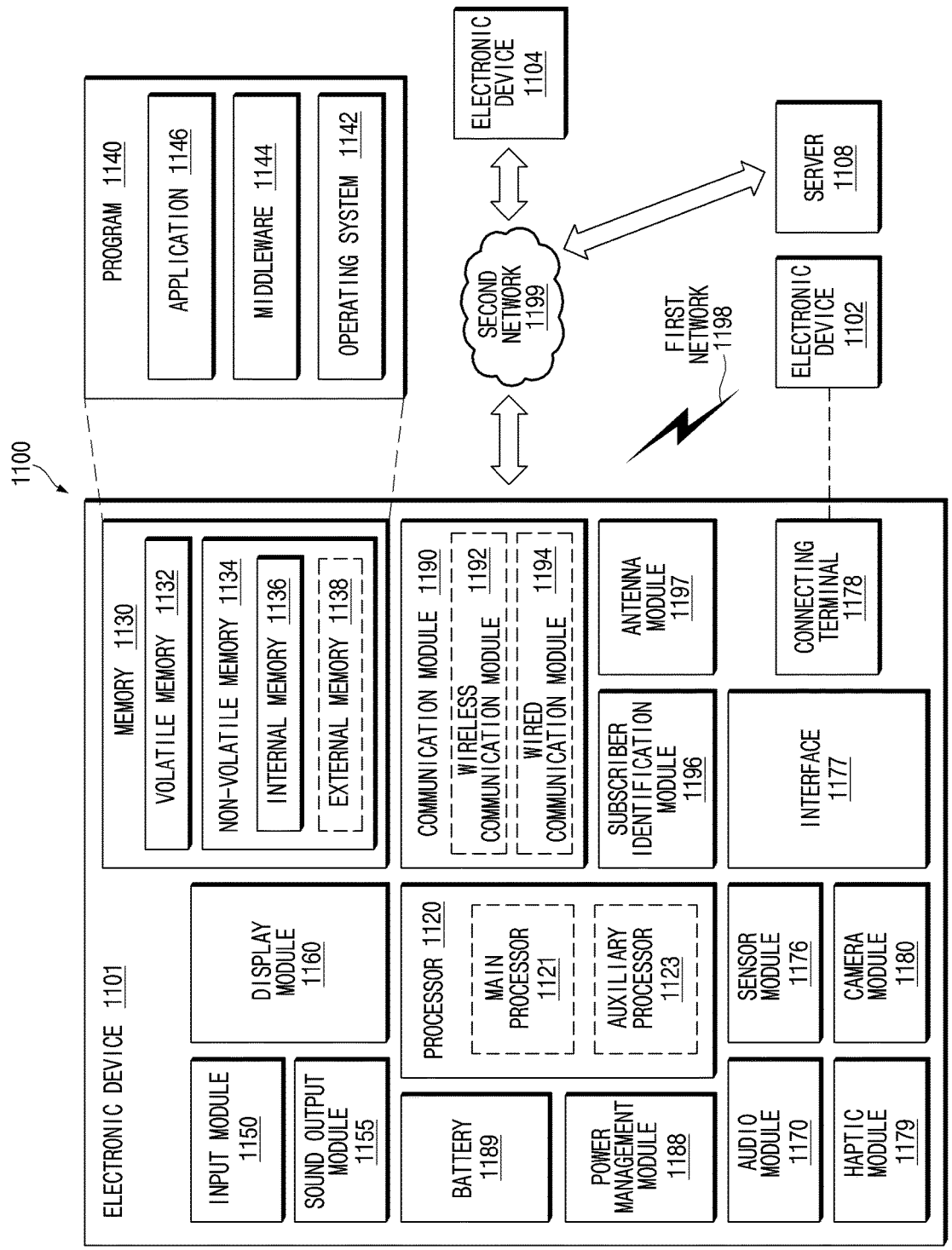
FIG. 11 is a block diagram illustrating an electronic device 1101 in a network environment 1100 according to an embodiment of the disclosure.

FIG. 11 is a block diagram illustrating an electronic device 1101 in a network environment 1100 according to an embodiment of the disclosure.

Referring to FIG. 11, the electronic device 1101 in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In some embodiments, at least one of the components (e.g., the connecting terminal 1178) may be omitted from the electronic device 1101, or one or more other components may be added in the electronic device 1101. In some embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, an HDMI connector, a USB connector, an SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™ Wi-Fi direct, or infrared data association (IrDA)) or the second network 1199 (e.g., a long-range communication network, such as a legacy cellular network, a 5th generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., 20 Gbps or more) for implementing eMBB, loss coverage (e.g., 1164 dB or less) for implementing mMTC, or U-plane latency (e.g., 0.5 ms or less for each of downlink (DL) and uplink (UL), or a round trip of 11 ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element composed of a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to various embodiments, the antenna module 1197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In another embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
  a board comprising a first conductive line, a second conductive line spaced apart from the first conductive line, a ground plane, and a conductive via hole electrically connecting the first conductive line and the ground plane;
  at least one electronic component disposed on a first surface of the board and configured to at least partially overlap the ground plane;
  an insulation member covering the at least one electronic component; and
  a conductive layer,
  wherein the conductive layer comprises:
    a first part disposed on a surface of the insulation member,
    a second part disposed on the first surface of the board and configured to extend from at least a portion of an edge of the first part in a direction away from the insulation member, and electrically connected to the first conductive line, and
    a third part spaced apart from the second part, the third part extending from the first surface of the board in the direction away from the insulation member, and being electrically connected to the second conductive line,
  wherein the first conductive line and the second part of the conductive layer are spaced apart from the second conductive line and the third part of the conductive layer with an opening in the board being interposed therebetween, and
  wherein the electronic device comprises at least one transmission line comprising the second conductive line and the third part of the conductive layer and configured to transmit an electrical signal.

2. The electronic device of claim 1,
  wherein a portion of the first conductive line is exposed through the first surface of the board, and
  wherein the second part of the conductive layer contacts the portion of the first conductive line.

3. The electronic device of claim 1,
  wherein a portion of the second conductive line is exposed through the first surface of the board, and wherein the third part of the conductive layer contacts the portion of the second conductive line.

4. The electronic device of claim 1,
  wherein a portion of the first conductive line is exposed through the first surface of the board and the exposed portion of the first conductive line contacts the second part of the conductive layer,
  wherein a portion of the second conductive line is exposed through the first surface of the board and the exposed portion of the second conductive line contacts the third part of the conductive layer, and
  wherein the opening is disposed between the portion of the first conductive line and the portion of the second conductive line.

5. The electronic device of claim 1,
  wherein the first part of the conductive layer comprises:
    a first edge,
    a second edge at least partially facing the first edge,
    a third edge connecting one end of the first edge and one end of the second edge, and
    a fourth edge connecting an opposite end of the first edge and an opposite end of the second edge, and at least partially facing the third edge, and
  wherein the first edge, the second edge, the third edge, and the fourth edge extend along a surface of the insulation member and a side surface of the board and are electrically connected to the ground plane.

6. The electronic device of claim 1,
  wherein the first part of the conductive layer comprises:
    a first edge,
    a second edge at least partially facing the first edge,
    a third edge connecting one end of the first edge and one end of the second edge, and
    a fourth edge connecting an opposite end of the first edge and an opposite end of the second edge, and at least partially facing the third edge,
  wherein the third part of the conductive layer comprises:
    a first area extending along the first edge,
    a second area extending along the second edge,
    a third area extending along the third edge, and
    a fourth area extending along the fourth edge, and
  wherein the first area, the second area, the third area, and the fourth area are electrically connected to the second conductive line to constitute the at least one transmission line.

7. The electronic device of claim 6,
  wherein the board further comprises another conductive line distinguished from the first conductive line and the second conductive line,
  wherein the conductive layer comprises a fourth part extending from at least one corner of the first part,
  wherein the fourth part of the conductive layer comprises at least one of:
    a fifth area that is adjacent to the first area and the third area of the third part,
    a sixth area that is adjacent to the first area and the fourth area of the third part,
    a seventh area that is adjacent to the second area and the third area of the third part, and
    an eighth area that is adjacent to the second area and the fourth area of the third part, and
  wherein the at least one of the fifth area, the sixth area, the seventh area, or the eighth area is electrically connected to the ground plane through the other conductive line of the board.

8. The electronic device of claim 1, comprising:
a first device and a second device disposed on a first surface of the board or a second surface facing an opposite direction to the first surface,
wherein the first device and the second device are located outside the insulation member, and are electrically connected to each other through the at least one transmission line, and
wherein the at least one transmission line is configured to transmit a power signal between the first device and the second device.

9. The electronic device of claim 1,
wherein the opening comprises a first opening and a second opening,
wherein the first opening is disposed along a direction that is substantially parallel to a direction in which an edge of the first part of the conductive layer extends,
wherein the second opening is disposed along a direction that is substantially perpendicular to the direction in which the edge of the first part of the conductive layer extends, and
wherein the at least one transmission line is disposed in the first opening and the second opening.

10. The electronic device of claim 1, comprising:
another electronic component distinguished from the at least one electronic component;
a connection member electrically connecting the other electronic component and the board;
a first connector disposed in the board to be electrically connected to the at least one transmission line; and
a second connector disposed in the connection member and coupled to the first connector,
wherein the other electronic component is electrically connected to the at least one transmission line through the connection member, the first connector, and the second connector.

11. The electronic device of claim 10, wherein the other electronic component comprises a battery or a key button switch.

12. The electronic device of claim 1,
wherein a first electronic component and a second electronic component distinguished from the at least one electronic component comprise:
a first connection member electrically connecting the first electronic component and a first transmission line of the at least one transmission line, and
a second connection member electrically connecting the first transmission line and a second transmission line of the at least one transmission line to the second electronic component, and
wherein the second electronic component is electrically connected to the first electronic component through the first transmission line, and is electrically connected to the ground plane of the board through the second transmission line.

13. The electronic device of claim 12,
wherein the second electronic component comprises a battery configured to provide electric power for an operation of the electronic device, and
wherein the first electronic component comprises a power management circuit for managing the battery.

14. The electronic device of claim 12,
wherein the first electronic component is disposed in the board,
wherein the first connection member comprises a conductive pattern formed in the board, and
wherein the second connection member comprises a flexible printed circuit board or a rigid-flexible printed circuit board.

15. The electronic device of claim 1, comprising:
a mechanical structure supporting the board;
a third connection member disposed between the board and the mechanical structure; and
an electronic component distinguished from the at least one electronic component and electrically connected to the at least one transmission line through the third connection member,
wherein the electronic component is electrically connected to the at least one transmission line while the mechanical structure and the board are coupled to each other.

16. A board of an electronic device comprising:
a first conductive line;
a second conductive line spaced apart from the first conductive line;
a ground plane;
a conductive via hole electrically connecting the first conductive line and the ground plane;
at least one electronic component disposed on a first surface of the board and configured to at least partially overlap the ground plane;
an insulation member covering the at least one electronic component; and
a conductive layer,
wherein the conductive layer comprises:
a first part disposed on a surface of the insulation member,
a second part disposed on the first surface of the board and configured to extend from at least a portion of an edge of the first part in a direction away from the insulation member, and electrically connected to the first conductive line, and
a third part spaced apart from the second part, the third part extending from the first surface of the board in the direction away from the insulation member, and electrically connected to the second conductive line,
wherein the first conductive line and the second part of the conductive layer are spaced apart from the second conductive line and the third part of the conductive layer with an opening in the board being interposed therebetween, and
wherein the board comprises at least one transmission line comprising the second conductive line and the third part of the conductive layer and configured to transmit an electrical signal.

17. The board of claim 16,
wherein a portion of the first conductive line is exposed through the first surface of the board, and
wherein the second part of the conductive layer contacts the portion of the first conductive line.

18. The board of claim 17,
wherein a portion of the second conductive line is exposed through the first surface of the board, and
wherein the third part of the conductive layer contacts the portion of the second conductive line.

19. The board of claim 18, wherein the opening is disposed between the portion of the first conductive line and the portion of the second conductive line.

20. The board of claim 16,
wherein a first device and a second device are disposed on a first surface of the board or a second surface facing an opposite direction to the first surface, wherein the first device and the second device are disposed outside the insulation member, and are electrically connected to each other through the at least one transmission line, and wherein the at least one transmission line is configured to transmit a power signal between the first device and the second device.

\* \* \* \* \*